United States Patent
Glodde et al.

(10) Patent No.: US 8,293,451 B2
(45) Date of Patent: Oct. 23, 2012

(54) NEAR-INFRARED ABSORBING FILM COMPOSITIONS

(75) Inventors: Martin Glodde, Yorktown Heights, NY (US); Dario L. Goldfarb, Yorktown Heights, NY (US); Wu-Song Huang, Hopewell Junction, NY (US); Wai-Kin Li, Hopewell Junction, NY (US); Sen Liu, Hopewell Junction, NY (US); Pushkara R. Varanasi, Hopewell Junction, NY (US); Libor Vyklicky, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 476 days.

(21) Appl. No.: 12/543,003

(22) Filed: Aug. 18, 2009

(65) Prior Publication Data

US 2011/0042653 A1 Feb. 24, 2011

(51) Int. Cl.
*G03F 7/00* (2006.01)
*G03F 7/004* (2006.01)
*G03F 7/028* (2006.01)

(52) U.S. Cl. ........ 430/270.1; 430/270.15; 430/311; 430/905; 430/913; 430/927; 430/944; 430/945

(58) Field of Classification Search .......... 430/270.1, 430/270.15, 905, 311, 913, 927, 945, 926, 430/944
See application file for complete search history.

(56) References Cited

U.S. PATENT DOCUMENTS

| | | | |
|---|---|---|---|
| 4,568,140 A | 2/1986 | Van der Werf | |
| 4,575,399 A | 3/1986 | Tanaka et al. | |
| 4,681,430 A | 7/1987 | Goel et al. | |
| 4,910,122 A | 3/1990 | Arnold et al. | |
| 5,059,808 A | 10/1991 | Tarui et al. | |
| 5,113,063 A | 5/1992 | Idesawa | |
| 5,401,618 A | 3/1995 | Chapman et al. | |
| 5,723,617 A | 3/1998 | Cuny | |
| 5,895,800 A * | 4/1999 | Kataoka et al. | 525/286 |
| 5,919,853 A | 7/1999 | Condit et al. | |
| 6,071,673 A * | 6/2000 | Iguchi et al. | 430/271.1 |
| 6,136,719 A | 10/2000 | Miller et al. | |
| 6,214,721 B1 | 4/2001 | Bendik, Jr. et al. | |
| 6,462,107 B1 * | 10/2002 | Sinclair et al. | 523/456 |

(Continued)

FOREIGN PATENT DOCUMENTS

GB 2484880 A 8/2010

(Continued)

OTHER PUBLICATIONS

Machine translation of JP 07-133475 (no date).*

(Continued)

*Primary Examiner* — Amanda C. Walke
(74) *Attorney, Agent, or Firm* — Scully, Scott, Murphy & Presser, P.C.; Yuanmin Cai

(57) ABSTRACT

A curable liquid formulation containing at least (i) one or more near-infrared absorbing triphenylamine-based dyes, and (ii) one or more casting solvents. The invention is also directed to solid near-infrared absorbing films composed of crosslinked forms of the curable liquid formulation. The invention is also directed to a microelectronic substrate containing a coating of the solid near-infrared absorbing film as well as a method for patterning a photoresist layer coated on a microelectronic substrate in the case where the near-infrared absorbing film is between the microelectronic substrate and a photoresist film.

17 Claims, 2 Drawing Sheets

U.S. PATENT DOCUMENTS

| | | | |
|---|---|---|---|
| 6,579,662 B1 | 6/2003 | Zheng et al. | |
| 6,689,518 B1 | 2/2004 | Williams et al. | |
| 6,861,201 B2 | 3/2005 | Weed et al. | |
| 7,175,949 B1 | 2/2007 | Tao et al. | |
| 7,217,839 B2 * | 5/2007 | Kimura et al. | 564/272 |
| 7,455,955 B2 * | 11/2008 | Shih et al. | 430/311 |
| 7,521,006 B2 * | 4/2009 | Ikeda et al. | 252/587 |
| 7,935,475 B2 * | 5/2011 | Seo et al. | 430/270.21 |
| 2005/0148786 A1 * | 7/2005 | Ikeda et al. | 552/301 |
| 2005/0163958 A1 | 7/2005 | Nakatsugawa | |
| 2005/0247916 A1 | 11/2005 | McCormick et al. | |
| 2006/0091365 A1 * | 5/2006 | Kitayama et al. | 252/587 |
| 2007/0048513 A1 * | 3/2007 | Okamoto et al. | 428/313.3 |
| 2008/0054227 A1 | 3/2008 | McCormick et al. | |
| 2008/0067479 A1 | 3/2008 | Kimura et al. | |
| 2009/0236571 A1 * | 9/2009 | Cohen | 252/587 |

FOREIGN PATENT DOCUMENTS

| | | | |
|---|---|---|---|
| JP | 7133475 A | | 5/1995 |
| JP | 07133475 A | * | 5/1995 |
| JP | 2000332424 A | * | 11/2000 |
| WO | WO 02083798 | | 10/2002 |

OTHER PUBLICATIONS

Machine Translation of JP 2000-332424 (no date).*
H.W. Sands Corporation, Jupiter, FL 33477, as product No. SDA4137, www.hwsands.com, pp. 1-12 (2007).
Fabian J. et al., "Near-Infrared Absorbing Dyes", Chemical Reviews 92(6):1197-1226 (1992).
Avdeenko A.A. et al., Twelfth International Symposium on the Physics and Chemistry of Luminescent Materials, Abs. No. 2455, Paris, France, Apr. 28, 2003.
Examination Report dated Apr. 3, 2012.

* cited by examiner

NEAR-INFRARED ABSORBING FILM COMPOSITIONS

BACKGROUND

The present invention generally relates to Z-level correction methods in the patterning of integrated semiconductor wafers.

The alignment and patterning of integrated silicon wafers during semiconductor chip manufacturing involves the application, sensing, and imaging of a photosensitive layer (photoresist) over complex underlying topography. Such buried topography usually consists of a multilayer stack that includes metal, dielectric, insulator or ceramic materials and combinations thereof, which are patterned and provide vertical and in-plane functionality to the chip. Photoresist patterning over such a multilayer stack requires wafer pre-alignment and surface level sensing in order to properly determine the focal plane position on the photoimageable layer. For this purpose, a broadband infrared source and photosensor combination is used to determine the focus position for the photoresist surface. In cases where the underlying topography consists of patterned reflective structures, reflection from such buried microstructures can induce an erroneous focal plane determination. Furthermore, in those cases where a sublayer contains a patterned metallic material (e.g., metals such as copper, aluminum, and tungsten), unwanted reflective notching or specular reflectance can also contribute to incorrect height level determination. Such erroneous focus determination results in image blur and poor contrast, which translates into defective image printing.

Proposed Z-leveling correction methods include the use of highly reflective coatings, such as metal layers on top of underlying topography or height-sensitive alignment devices. In the first case, the metallic layer presents an integration problem at the time of manufacturing a functional three-dimensional structure, and thus, is generally not a viable solution. In the second case, a substrate-specific calibration of the optical leveling system is performed, e.g., with AGILE or an offline calibration method (FEM+'focus mapper'); however, this approach has several drawbacks, including being generally too slow to be performed on every wafer and within lot (across-wafer and wafer-to-wafer) substrate changes are uncompensated.

Accordingly, there is a need in the art for a Z-leveling correction method which is generally simple to employ, accurate, readily integratable with microelectronic fabrication processes, and which does not suffer from the drawbacks described above.

SUMMARY

The invention generally involves use of a planarizing layer in the form of a near-infrared (NIR) absorbing film containing one or more chromophores (i.e., dyes) having an absorption range partially or completely covering the signal of focus leveling sensor in the near-IR region. Such a layer, when applied onto a multilayer stack, functions by blocking broadband NIR radiation by absorption, thus preventing underlying topographic features located at an arbitrary depth within the multilayer stack to be detected by the focus leveling sensor. Sensing only the top wafer surface allows an accurate placement of the photoresist layer within the imaging plane.

In one aspect, the invention is directed to a curable liquid formulation which includes (i) one or more near-infrared absorbing triphenylamine-based dyes, and (ii) one or more casting solvents. In a preferred embodiment, the triphenylamine-based dye has the following generic formula:

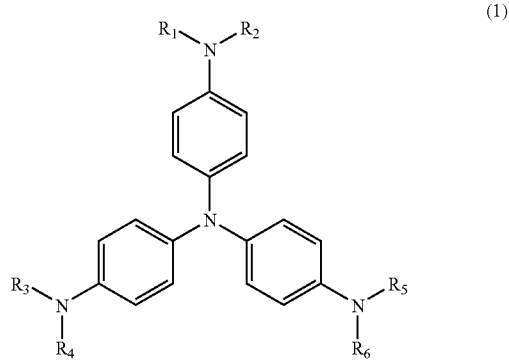

(1)

In formula (1) above, $R_1$, $R_2$, $R_3$, $R_4$, $R_5$, and $R_6$ independently represent a hydrogen atom or a hydrocarbon group containing at least one carbon atom, wherein a hydrocarbon group optionally includes one or more heteroatoms selected from nitrogen, oxygen, sulfur, and halide atoms. Preferably, at least one of $R_1$, $R_2$, $R_3$, $R_4$, $R_5$, and $R_6$ is a hydrocarbon group. One or more nitrogen atoms in formula (1) above are cation radicals, and the one or more cation radicals are charge balanced by one or more anions.

In a particular embodiment of formula (1), the dye molecule includes at least one, two, three, or more crosslinkable groups (i.e., one, two, three, or more of $R_1$, $R_2$, $R_3$, $R_4$, $R_5$, and $R_6$ include a crosslinkable moiety). Any of $R_1$, $R_2$, $R_3$, $R_4$, $R_5$, and $R_6$ can also include two or more crosslinkable groups therein.

In a second aspect, the invention is directed to a curable liquid formulation which includes (i) one or more near-infrared absorbing triphenylamine-based dyes, (ii) one or more crosslinkable polymers; and (iii) one or more casting solvents.

In a third aspect, the invention is directed to a curable liquid formulation which includes (i) one or more crosslinkable near-infrared absorbing triphenylamine-based dyes; and (ii) one or more casting solvents.

In a fourth aspect, the invention is directed to a solid near-infrared absorbing film which is a crosslinked form of the curable liquid formulation. In one embodiment, the near-infrared absorbing film includes one or more near-infrared absorbing triphenylamine-based dyes and one or more crosslinked polymers. In another embodiment, the near-infrared absorbing film includes one or more near-infrared absorbing triphenylamine-based dyes crosslinked by one or more crosslinking groups on the triphenylamine-based dyes.

In a fifth aspect, the invention is directed to a microelectronic structure which includes (a) a microelectronic substrate; (b) a solid near-infrared absorbing film, as described above, covering the microelectronic substrate; and (c) a photoresist film covering the near-infrared absorbing film.

In a sixth aspect, the invention is directed to a method for patterning a photoresist layer coated on a microelectronic substrate. The method preferably includes (i) providing a microelectronic substrate; (ii) forming a solid near-infrared absorbing film, as described above, covering the microelectronic substrate; (iii) forming a photoresist layer over the near-infrared absorbing layer; (iv) aligning and focusing a focal plane position of the photoresist layer by sensing near-infrared emissions reflected from the microelectronic substrate containing the near-infrared absorbing layer and photoresist layer; and (v) exposing the photoresist layer to an exposure beam which patterns the photoresist.

Unlike presently known solutions to the problem, the present invention can be used independent of machine model and number, represents little up-front investment, it is not a low throughput detractor, requires low maintenance, and may have secondary metrology applications (RIE control, defect detection, etc.).

DETAILED DESCRIPTION OF PARTICULAR EMBODIMENTS

Figure 1:
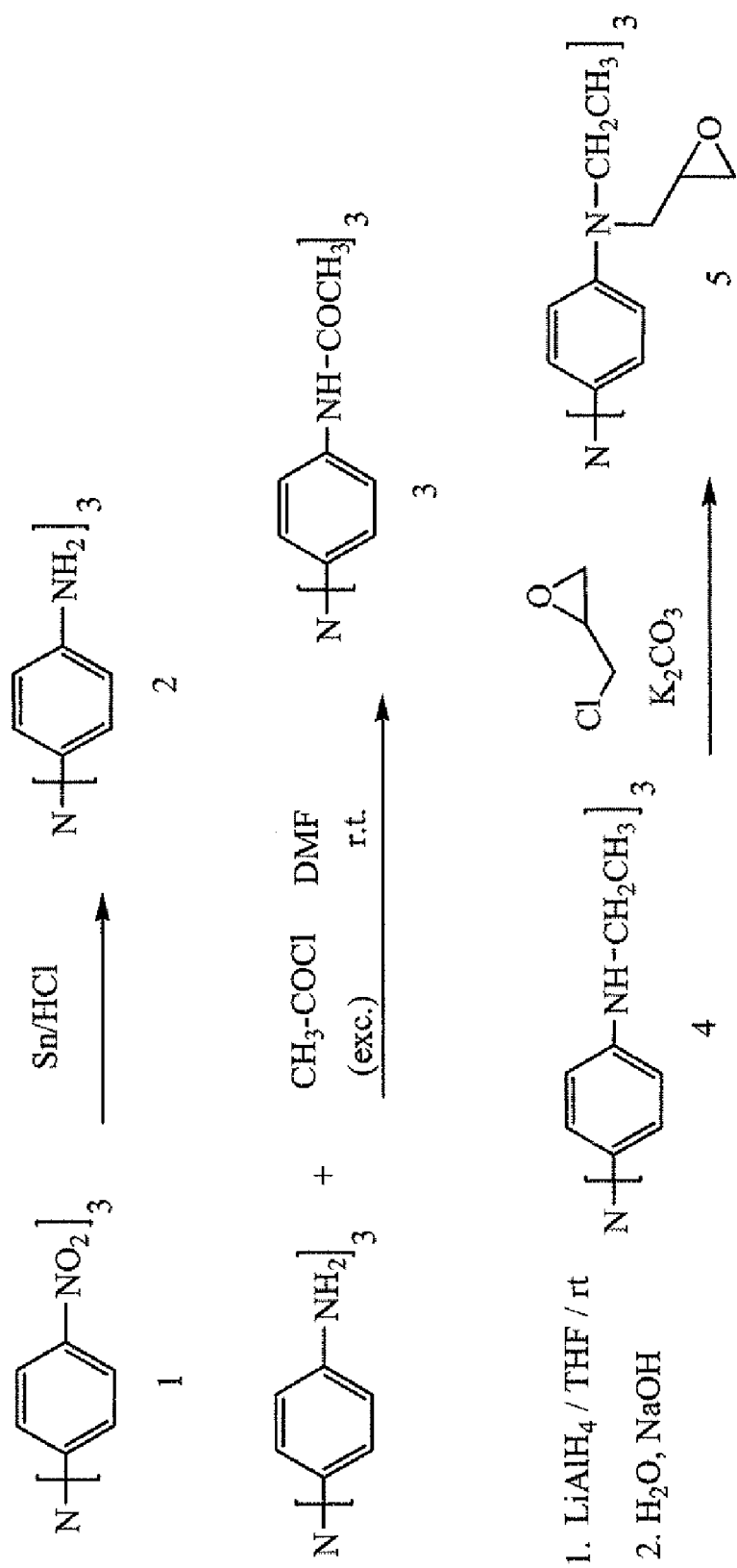
FIG. 1 is a general schematic showing the synthesis of tris(4-[N-ethyl, N-glycidylamino]phenyl)amine (5), an exemplary dye of the invention.

The term "hydrocarbon group", as used herein, refers, in a first embodiment, to a chemical group composed solely of carbon and hydrogen. In different embodiments, one or more of the hydrocarbon groups can contain precisely, or a minimum of, or a maximum of, for example, one, two, three, four, five, six, seven, eight, nine, ten, eleven, twelve, thirteen, fourteen, fifteen, sixteen, seventeen, or eighteen carbon atoms, or a particular range of carbon atoms between any of the foregoing carbon numbers.

The hydrocarbon groups can be, for example, saturated and straight-chained (i.e., straight-chained alkyl groups). Some examples of straight-chained alkyl groups include methyl, ethyl, n-propyl, n-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, and n-octadecyl groups.

The hydrocarbon groups can alternatively be saturated and branched (i.e., branched alkyl groups). Some examples of branched alkyl groups include isopropyl, isobutyl, sec-butyl, t-butyl, isopentyl, neopentyl, 2-methylpentyl, 3-methylpentyl, and the numerous $C_7$, $C_8$, $C_9$, $C_{10}$, $C_{11}$, $C_{12}$, $C_{13}$, $C_{14}$, $C_{15}$, $C_{16}$, $C_{17}$, and $C_{18}$ saturated and branched hydrocarbon groups.

The hydrocarbon groups can alternatively be saturated and cyclic (i.e., cycloalkyl groups). Some examples of cycloalkyl groups include cyclopropyl, cyclobutyl, cyclopentyl, cyclohexyl, cycloheptyl, and cyclooctyl groups. The cycloalkyl group can also be a polycyclic (e.g., bicyclic) group by either possessing a bond between two ring groups (e.g., dicyclohexyl) or a shared (i.e., fused) side (e.g., decalin and norbornane).

The hydrocarbon groups can alternatively be unsaturated and straight-chained (i.e., straight-chained olefinic or alkenyl groups). Some examples of straight-chained olefinic groups include vinyl, 2-propen-1-yl, 3-buten-1-yl, 2-buten-1-yl, butadienyl, 4-penten-1-yl, 3-penten-1-yl, 2-penten-1-yl, 2,4-pentadien-1-yl, 5-hexen-1-yl, 4-hexen-1-yl, 3-hexen-1-yl, 3,5-hexadien-1-yl, 1,3,5-hexatrien-1-yl, 6-hepten-1-yl, ethynyl, propargyl (2-propynyl), and the numerous $C_7$, $C_8$, $C_9$, $C_{10}$, $C_{11}$, $C_{12}$, $C_{13}$, $C_{14}$, $C_{15}$, $C_{16}$, $C_{17}$, and $C_{18}$ unsaturated and straight-chained hydrocarbon groups.

The hydrocarbon groups can alternatively be unsaturated and branched (i.e., branched olefinic or alkenyl groups). Some examples of branched olefinic groups include 2-propen-2-yl, 3-buten-2-yl, 3-buten-3-yl, 4-penten-2-yl, 4-penten-3-yl, 3-penten-2-yl, 3-penten-3-yl, 2,4-pentadien-3-yl, and the numerous $C_6$, $C_7$, $C_8$, $C_9$, $C_{10}$, $C_{11}$, $C_{12}$, $C_{13}$, $C_{14}$, $C_{15}$, $C_{16}$, $C_{17}$, and $C_{18}$ unsaturated and branched hydrocarbon groups.

The hydrocarbon groups can alternatively be unsaturated and cyclic (i.e., cycloalkenyl groups or cycloalkenylene linkers). Some examples of unsaturated and cyclic hydrocarbon groups include cyclopropenyl, cyclobutenyl, cyclopentenyl, cyclopentadienyl, cyclohexenyl, cyclohexadienyl, phenyl, benzyl, cycloheptenyl, cycloheptadienyl, cyclooctenyl, cyclooctadienyl, and cyclooctatetraenyl groups. The unsaturated cyclic hydrocarbon group can also be a polycyclic (e.g., bicyclic or tricyclic) group by either possessing a bond between two of the ring groups (e.g., biphenyl) or a shared (i.e., fused) side (e.g., naphthalene, anthracene, and phenanthrene).

The hydrocarbon groups may also include one or more heteroatoms, such as one or more oxygen, nitrogen, sulfur, or halide atoms. In different embodiments, the hydrocarbon group may include only one or more nitrogen atoms and no other heteroatoms, or only one or more oxygen atoms and no other heteroatoms, or only sulfur atoms and no other heteroatoms, or only nitrogen and oxygen and not sulfur, or only nitrogen and sulfur and not oxygen, or only oxygen and sulfur and not nitrogen. Some particular examples of oxygen-containing groups include those of formula —$XR_8$ wherein X is O or S and $R_8$ is a hydrogen atom or a hydrocarbon group as described above or optionally containing one or more heteroatoms selected from oxygen, nitrogen, and sulfur atoms. Other oxygen-containing groups include carbonyl groups (e.g., ketone, aldehyde, ester, amide, or urea functionalities). The —$XR_8$ group can also be a polyalkyleneoxide group, such as a polyethyleneoxide group. Some particular examples of nitrogen-containing groups include those of formula —$NR_9R_{10}$ wherein $R_9$ and $R_{10}$ are each independently a hydrogen atom or hydrocarbon group optionally containing one or more heteroatoms selected from oxygen, nitrogen, and sulfur atoms. In addition, the nitrogen-containing groups can be primary amine groups, secondary amine groups, tertiary amine groups, or quaternary amine groups. Some other nitrogen-containing groups may include cyanide, amide (i.e., —$C(O)NR_2$, wherein R is selected from hydrogen atom and hydrocarbon group), nitro group, urea group, and carbamate group, wherein it is understood that a quaternary amine group necessarily possesses a positive charge and requires a counteranion. Some examples of sulfur-containing groups include the thioether (i.e., sulfide), disulfide, sulfoxide, sulfone, sulfonate, and sulfate groups. Halide atoms considered herein include fluorine, chlorine, bromine, and iodine. Some examples of fluorine-containing hydrocarbon groups (i.e., fluorocarbon groups) include the partially-substituted varieties (e.g., fluoromethyl, difluoromethyl, 2-fluoroethyl, 2,2-difluoroethyl, 2,2,2-trifluoroethyl, and the like) and per-fluoro-substituted varieties (e.g., perfluoromethyl, perfluoroethyl, perfluoropropyl, perfluorobutyl, and the like).

The hydrocarbon group can also include a ring structure (e.g., a monocyclic ring or polycyclic ring system) which contains one or more (e.g., one, two, three, or four) ring nitrogen atoms. The nitrogen-containing rings can be, for example, saturated monocyclic, saturated polycyclic, unsaturated monocyclic, or unsaturated polycyclic. In one embodiment, the nitrogen-containing ring groups or ring systems can also include other ring heteroatoms, such as oxygen or sulfur atoms. In another embodiment, the nitrogen-containing ring groups or ring systems exclude other ring heteroatoms. Some examples of saturated monocyclic nitrogen-containing ring groups include pyrrolidine, piperidine, piperazine, and morpholine groups. Some examples of unsaturated monocyclic nitrogen-containing ring groups include pyrrole, imidazole, pyrazole, pyridine, pyrazine, 1,3,5-triazine, pyrimidine, oxazole, thiazole, and thiazine groups. Some examples of saturated polycyclic nitrogen-containing ring systems include decahydroquinoline and decahydro-1,8-naphthyridine groups. Some examples of unsaturated polycyclic nitrogen-containing ring systems include indole, purine, benzimidazole, 4,4'-bipyridine, 2,2'-bipyridine, 1,8-naphthyridine, quinoline, quinazoline, phenazine, benzoxazole, benzothiazole, 2-phenylpyridine, 2,6-diphenylpyridine, and benzothiazine groups.

The hydrocarbon group can also include a ring structure which contains one or more (e.g., one, two, three, or four) ring oxygen atoms. The oxygen-containing rings can be, for example, saturated monocyclic, saturated polycyclic, unsaturated monocyclic, or unsaturated polycyclic. In one embodiment, the oxygen-containing ring groups or ring systems can also include other ring heteroatoms, such as nitrogen or sulfur atoms. In another embodiment, the oxygen-containing ring groups or ring systems exclude other ring heteroatoms. Some examples of saturated monocyclic oxygen-containing ring groups include tetrahydrofuran, tetrahydropyran, 1,4-dioxane, 1,3-dioxane, 1,3-dioxolane, and 1,4-oxathiane groups. Some examples of unsaturated monocyclic oxygen-containing ring groups include furan, pyran, and 1,4-dioxine groups. An example of a saturated polycyclic oxygen-containing ring system includes the octahydro-1-benzopyran group. Some examples of unsaturated polycyclic oxygen-containing ring systems include 1-benzopyran (chromene), 2-benzopyran (isochromene), 2-phenylfuran, 2-phenylpyran, coumarin, and 1,4-benzopyrone (chromone) groups.

The hydrocarbon group can also include a ring structure which contains one or more (e.g., one, two, three, or four) ring sulfur atoms. The sulfur-containing rings can be, for example, saturated monocyclic, saturated polycyclic, unsaturated monocyclic, or unsaturated polycyclic. In one embodiment, the sulfur-containing ring groups or ring systems can also include other ring heteroatoms, such as nitrogen or oxygen atoms. In another embodiment, the sulfur-containing ring groups or ring systems exclude other ring heteroatoms. Some examples of saturated monocyclic sulfur-containing ring groups include tetrahydrothiofuran, tetrahydrothiopyran, 1,4-dithiane, 1,3-dithiane, 1,2-dithiolane, and 1,4-dithiolane groups. Some examples of unsaturated monocyclic sulfur-containing ring groups include thiophene, thiopyran, and 1,4-dithiine groups. An example of a saturated polycyclic sulfur-containing ring system includes the octahydro-1-benzothiopyran group. Some examples of unsaturated polycyclic sulfur-containing ring systems include 1-thiobenzopyran (thiochromene), 2-benzothiopyran (isothiochromene), 2-phenylthiophene, 2-phenylthiofuran, 2,6-diphenylthiopyran, and thiocoumarin groups.

In one aspect, the invention is directed to a curable liquid formulation which includes at least (i) one or more near-infrared absorbing triphenylamine-based dyes (i.e., "dyes"), and (ii) one or more casting solvents. The dye can be any triphenylamine-based dye which absorbs near-infrared wavelengths of electromagnetic radiation. Furthermore, two or more dyes can be used to absorb within a preferred range of infrared wavelengths. The near-infrared wavelengths being considered herein broadly encompass any of the wavelengths within 500 nm to 5,000 nm. In different embodiments, the dye absorbs near-infrared wavelengths in a range bounded by a minimum wavelength of, for example, 400 nm, 450 nm, 500 nm, 550 nm, 600 nm, 650 nm, 700 nm, 750 nm, 800 nm, or 850 nm, and a maximum wavelength of, for example, 700 nm, 750 nm, 800 nm, 850 nm, 900 nm, 950 nm, 1000 nm, 1050 nm, 1100 nm, 1150 nm, 1200 nm, 1250 nm, 1300 nm, 1400 nm, 1500 nm, 2000 nm, 2500 nm, 3000 nm, 3500 nm, 4000 nm, 4500 nm, and 5000 nm. Any range governed by any combination of the foregoing minimum and maximum values are applicable herein. The foregoing exemplary absorption ranges can be achieved either by use of a single dye, or alternatively, by use of more than one dye (e.g., two, three, or four dyes). In addition, the dyes are preferably passive, i.e., not photoactive.

Some examples of such triphenylamine-based dyes include triphenylamine, as well as triphenylamine substituted by one, two, three, four, five, six, or more hydrocarbon groups (e.g., diphenylnaphthylamine, tris-(p-tolyl)amine, tris-(o-tolyl)amine, dinaphthylphenylamine, diphenylanthracenylamine, diphenylphenanthrenylamine, tris-p-bromo)amine, tris-(p-chloro)amine, and tris-(p-fluoro)amine).

Preferably, the triphenylamine-based dyes have a structure within the following generic formula:

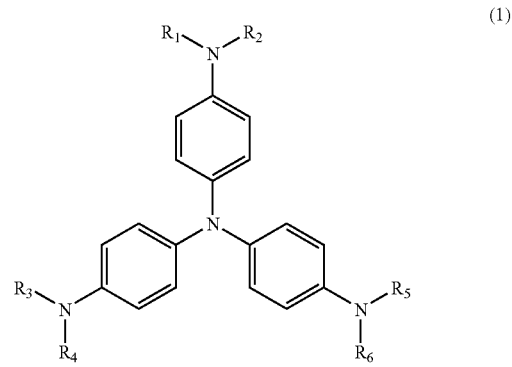

(1)

In the particular case where the dye molecule includes one or no crosslinkable groups, (i.e., one or no crosslinkable groups is included amongst $R_1$, $R_2$, $R_3$, $R_4$, $R_5$, and $R_6$ groups), inclusion of one or more crosslinkable polymers is desirable in the liquid formulation to render the liquid formulation curable. In the particular case where the dye molecule includes at least two crosslinkable groups (i.e., two or more crosslinkable groups is included amongst $R_1$, $R_2$, $R_3$, $R_4$, $R_5$, and $R_6$ groups), a crosslinkable polymer can be included, if desired, but can be dispensed with if crosslinking only between dye molecules is desired.

In formula (1) above, $R_1$, $R_2$, $R_3$, $R_4$, $R_5$, and $R_6$ independently represent a hydrogen atom or a hydrocarbon group containing at least one carbon atom, wherein the hydrocarbon group optionally includes one or more heteroatoms selected from nitrogen, oxygen, sulfur, and halide atoms, as described above, provided that at least one of $R_1$, $R_2$, $R_3$, $R_4$, $R_5$, and $R_6$ is a hydrocarbon group. In one embodiment, all of $R_1$, $R_2$, $R_3$, $R_4$, $R_5$, and $R_6$ are hydrogen atoms, thereby resulting in the compound tris-(p-aminophenyl)amine. In different embodiments, one, two, three, four, five, or all of $R_1$, $R_2$, $R_3$, $R_4$, $R_5$, and $R_6$ are hydrocarbon groups (i.e., optionally heteroatom-derivatized) while the remaining groups are hydrogen atoms. In particular embodiments, the one or more hydrocarbon groups contain precisely, or at least, or no more than one, two, three, four, five, six, seven, eight, nine, ten, eleven, or twelve carbon atoms, or a range of carbon atoms between any of these carbon numbers. In one embodiment, none of $R_1$, $R_2$, $R_3$, $R_4$, $R_5$, and $R_6$ include an aromatic ring (e.g., phenyl or naphthyl) directly bound to the nitrogen atom to which they are bound, while in other embodiments, one, two, three, four, five, or all of $R_1$, $R_2$, $R_3$, $R_4$, $R_5$, and $R_6$ include an aromatic ring directly bound to the nitrogen atom to which they are bound.

Formula (1) also includes the possibility that one or more groups residing on the same nitrogen atom (i.e., one or more of $R_1$ and $R_2$, and/or $R_3$ and $R_4$, and/or $R_5$ and $R_6$) can interconnect to form a nitrogen-containing heterocyclic ring. Any of the nitrogen-containing heterocyclic rings described above are applicable herein.

In a particular embodiment of formula (1), at least one of $R_1$, $R_2$, $R_3$, $R_4$, $R_5$, and $R_6$ contains one or more crosslinkable groups, i.e., crosslinkable between dye molecules or between dye molecules and one or more crosslinkable polymers. The crosslinkable group can be any suitable group capable of crosslinking with another chemical group. Preferably, the one or more crosslinkable groups are selected from reactive cyclic ether groups (e.g., oxacyclobutyl or epoxide groups) and hydroxy groups. In different embodiments, one, two, three, four, five, or all of $R_1$, $R_2$, $R_3$, $R_4$, $R_5$, and $R_6$ contain one or more crosslinkable groups. In a particular embodiment, at least one of $R_1$ and $R_2$, at least one of $R_3$ and $R_4$, and at least one of $R_5$ and $R_6$ is a hydrocarbon group containing a reactive oxygen-containing ring or hydroxy group.

In a preferred embodiment, the one or more epoxy-containing groups are according to the following formula:

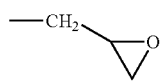

(2)

In a preferred embodiment, the one or more hydroxy-containing groups are according to the following formula:

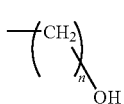

(3)

In formulae (2) and (3) above, the subscript n preferably represents, in different embodiments, a number of, or at least, or at most, 1, 2, 3, 4, 5, 6, 7, 8, 9, 10, 11, or 12, or a number within a range bounded by any two of these numbers.

In particular embodiments of formula (1), $R_1$, $R_2$, $R_3$, $R_4$, $R_5$, and $R_6$ are independently selected from: (i) hydrocarbon groups (particularly, straight-chained or branched alkyl groups of 1-12 carbon atoms), (ii) epoxy-containing groups, and (iii) hydroxy-containing groups. For example, in different embodiments, $R_1$, $R_2$, $R_3$, $R_4$, $R_5$, and $R_6$ can be all hydrocarbon groups, or all epoxy-containing groups, or all hydroxy-containing groups, or a mixture of hydrocarbon groups and epoxy-containing groups, or a mixture of hydrocarbon groups and hydroxy-containing groups, or a mixture of epoxy-containing groups and hydroxy-containing groups.

In a first embodiment of formula (1), one or more of $R_1$, $R_2$, $R_3$, $R_4$, $R_5$, and $R_6$ are hydrocarbon groups and one or more of $R_1$, $R_2$, $R_3$, $R_4$, $R_5$, and $R_6$ are epoxy-containing groups. In particular embodiments, at least two, three, four, or five of $R_1$, $R_2$, $R_3$, $R_4$, $R_5$, and $R_6$ are epoxy-containing groups while the remaining groups are hydrocarbon groups. For example, in a particular embodiment, $R_1$, $R_3$, and $R_5$ are epoxy-containing groups, while $R_2$, $R_4$, and $R_6$ are hydrocarbon groups.

In a second embodiment of formula (1), one or more of $R_1$, $R_2$, $R_3$, $R_4$, $R_5$, and $R_6$ are hydrocarbon groups and one or more of $R_1$, $R_2$, $R_3$, $R_4$, $R_5$, and $R_6$ are hydroxy-containing groups. In particular embodiments, at least two, three, four, or five of $R_1$, $R_2$, $R_3$, $R_4$, $R_5$, and $R_6$ are hydroxy-containing groups while the remaining groups are hydrocarbon groups. For example, in a particular embodiment, $R_1$, $R_3$, and $R_5$ are hydroxy-containing groups while $R_2$, $R_4$, and $R_6$ are hydrocarbon groups.

In a third embodiment of formula (1), one or more of $R_1$, $R_2$, $R_3$, $R_4$, $R_5$, and $R_6$ are epoxy-containing groups and one or more of $R_1$, $R_2$, $R_3$, $R_4$, $R_5$, and $R_6$ are hydroxy-containing groups. In particular embodiments, at least two, three, four, or five of $R_1$, $R_2$, $R_3$, $R_4$, $R_5$, and $R_6$ are epoxy-containing groups while the remaining groups are hydroxy-containing groups. In other particular embodiments, at least two, three, four, or five of $R_1$, $R_2$, $R_3$, $R_4$, $R_5$, and $R_6$ are hydroxy-containing groups while the remaining groups are epoxy-containing groups. For example, in a particular embodiment, $R_1$, $R_3$, and $R_5$ are hydroxy-containing groups while $R_2$, $R_4$, and $R_6$ are epoxy-containing groups.

In a particular embodiment of formula (1), at least two of $R_1$, $R_2$, $R_3$, $R_4$, $R_5$, and $R_6$ on the same nitrogen atom, as shown in the formula, are p-amino-substituted phenyl groups. Such dyes are conveniently represented by the following formula:

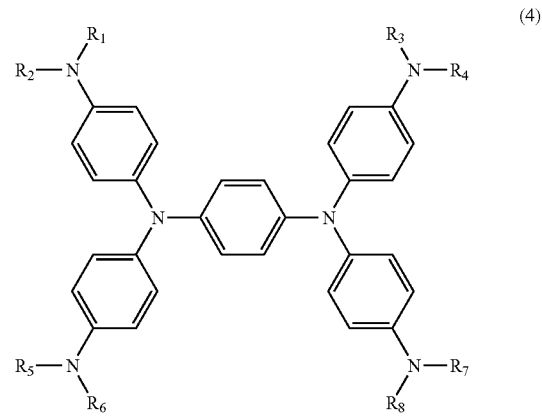

(4)

In the particular case where the dye molecule includes one or no crosslinkable groups, (i.e., one or no crosslinkable groups is included amongst $R_1$, $R_2$, $R_3$, $R_4R_5$, $R_6$, $R_7$, and $R_8$ groups), inclusion of one or more crosslinkable polymers is desirable in the liquid formulation to render the liquid formulation curable. In the particular case where the dye molecule includes at least two crosslinkable groups (i.e., two or more crosslinkable groups is included amongst $R_1$, $R_2$, $R_3$, $R_4R_5$, $R_6$, $R_7$, and $R_8$ groups), a crosslinkable polymer can be included, if desired, but can be dispensed with if crosslinking only between dye molecules is desired.

In formula (4) above, $R_1$, $R_2$, $R_3$, $R_4$, $R_5$, $R_6$, $R_7$, and $R_8$ independently represent a hydrogen atom or a hydrocarbon group containing at least one carbon atom, wherein the hydrocarbon group optionally includes one or more heteroatoms selected from nitrogen, oxygen, sulfur, and halide atoms, as described above. Preferably, at least one of $R_1$, $R_2$, $R_3$, $R_4$, $R_5$, $R_6$, $R_7$, and $R_8$ is a hydrocarbon group. In one embodiment, all of $R_1$, $R_2$, $R_3$, $R_4$, $R_5$, $R_6$, $R_7$, and $R_8$ are hydrogen atoms, thereby resulting in the compound tetrakis-[N,N,N'-(p-aminophenyl)]phenylenediamine. In different embodiments, one, two, three, four, five, six, seven, or all of $R_1$, $R_2$, $R_3$, $R_4R_5$, R6, $R_7$, and $R_8$ are hydrocarbon groups (i.e., optionally heteroatom-derivatized) while the remaining groups are hydrogen atoms. In particular embodiments, the one or more hydrocarbon groups contain precisely, or at least, or no more than one, two, three, four, five, six, seven, eight, nine, ten, eleven, or twelve carbon atoms, or a range of carbon atoms between any of these carbon numbers. In one embodiment, none of $R_1$, $R_2$, $R_3$, $R_4$, $R_5$, $R_6$, $R_7$, and $R_8$ include an aromatic ring (e.g., phenyl or naphthyl) directly bound to the nitrogen atom to which they are bound, while in other embodiments, one, two, three, four, five, six, seven, or all of $R_1$, $R_2$, $R_3$, $R_4$, $R_5$, $R_6$, $R_7$, and $R_8$ include an aromatic ring directly bound to the nitrogen atom to which they are bound.

As in formula (1), formula (4) also includes the possibility that one or more groups residing on the same nitrogen atom (i.e., one or more of $R_1$ and $R_2$, and/or $R_3$ and $R_4$, and/or $R_5$ and $R_6$, and/or $R_7$ and $R_8$) can interconnect to form a nitrogen-containing heterocyclic ring. Any of the nitrogen-containing heterocyclic rings described above are applicable herein.

In a particular embodiment of formula (4), at least one of $R_1$, $R_2$, $R_3$, $R_4$, $R_5$, $R_6$, $R_7$, and $R_8$ contains one or more crosslinkable groups, i.e., crosslinkable between dye molecules or between dye molecules and one or more crosslinkable polymers. The crosslinkable group can be any suitable group capable of crosslinking with another chemical group. Preferably, the one or more crosslinkable groups are selected from reactive cyclic ether groups (e.g., oxacyclobutyl or epoxide groups) and hydroxy groups (as exemplified by formulae 2 and 3 above). In different embodiments, one, two, three, four, five, six, seven, or all of $R_1$, $R_2$, $R_3$, $R_4R_5$, $R_6$, $R_7$, and $R_8$ contain one or more crosslinkable groups. In a particular embodiment, at least one of $R_1$ and $R_2$, at least one of $R_3$ and $R_4$, at least one of $R_5$ and $R_6$, and at least one of $R_7$ and $R_8$ is a hydrocarbon group containing a reactive oxygen-containing ring or hydroxy group.

In particular embodiments of formula (4), $R_1$, $R_2$, $R_3$, $R_4$, $R_5$, $R_6$, $R_7$, and $R_8$ are independently selected from: (i) hydrocarbon groups (particularly, straight-chained or branched alkyl groups of 1-12 carbon atoms), (ii) epoxy-containing groups, and (iii) hydroxy-containing groups. For example, in different embodiments, $R_1$, $R_2$, $R_3$, $R_4$, $R_5$, $R_6$, $R_7$, and $R_8$ can be all hydrocarbon groups, or all epoxy-containing groups, or all hydroxy-containing groups, or a mixture of hydrocarbon groups and epoxy-containing groups, or a mixture of hydrocarbon groups and hydroxy-containing groups, or a mixture of epoxy-containing groups and hydroxy-containing groups.

In a first embodiment of formula (4), one or more of $R_1$, $R_2$, $R_3$, $R_4$, $R_5$, $R_6$, $R_7$, and $R_8$ are hydrocarbon groups and one or more of $R_1$, $R_2$, $R_3$, $R_4R_5$, $R_6$, $R_7$, and $R_8$ are epoxy-containing groups. In particular embodiments, at least two, three, four, five, six, or seven of $R_1$, $R_2$, $R_3$, $R_4$, $R_5$, $R_6$, $R_7$, and $R_8$ are epoxy-containing groups while the remaining groups are hydrocarbon groups. For example, in a particular embodiment, $R_1$, $R_3$, $R_5$, and $R_7$ are epoxy-containing groups, while $R_2$, $R_4$, $R_6$, and $R_8$ are hydrocarbon groups.

In a second embodiment of formula (4), one or more of $R_1$, $R_2$, $R_3$, $R_4$, $R_5$, $R_6$, $R_7$, an are hydrocarbon groups and one or more of $R_1$, $R_2$, $R_3$, $R_4$, $R_5$, $R_6$, $R_7$, and $R_8$ are hydroxy-containing groups. In particular embodiments, at least two, three, four, five, six, or seven of $R_1$, $R_2$, $R_3$, $R_4$, $R_5$, $R_6$, $R_7$, and $R_8$ are hydroxy-containing groups while the remaining groups are hydrocarbon groups. In another particular embodiment, $R_1$, $R_3$, $R_5$, and $R_7$ are hydroxy-containing groups while $R_2$, $R_4$, $R_6$, and $R_8$ are hydrocarbon groups.

In a third embodiment of formula (4), one or more of $R_1$, $R_2$, $R_3$, $R_4$, $R_5$, $R_6$, $R_7$, and $R_8$ are epoxy-containing groups and one or more of $R_1$, $R_2$, $R_3$, $R_4R_5$, $R_6$, $R_7$, and $R_8$ are hydroxy-containing groups. In particular embodiments, at least two, three, four, five, six, or seven of $R_1$, $R_2$, $R_3$, $R_4$, $R_5$, $R_6$, $R_7$, and $R_8$ are epoxy-containing groups while the remaining groups are hydroxy-containing groups. In other particular embodiments, at least two, three, four, five, six, or seven of $R_1$, $R_2$, $R_3$, $R_4R_5$, $R_6$, $R_7$, and $R_8$ are hydroxy-containing groups while the remaining groups are epoxy-containing groups. In another particular embodiment, $R_1$, $R_3$, $R_5$, and $R_7$ are hydroxy-containing groups while $R_2$, $R_4$, $R_6$, and $R_8$ are epoxy-containing groups.

For the sake of simplicity, formulae (1) and (4) depict all nitrogen atoms as uncharged (i.e., not as cation radicals). However, the formulas include that one or more nitrogen atoms (either shown or not shown) are in the form of a cation radical, wherein it is understood that a cation radical is necessarily charge balanced by one or more anions of equivalent overall charge. The cation radical forms of formulae (1) and (4) cause the dye to absorb in the near-infrared range. In different embodiments, for example, one, two, three, four, five, six, or more nitrogen atoms within formula (1) or (4), as shown or not shown, are in the form of cation radicals. These can be referred to, respectively, as aminium, diaminium, triaminium, tetraaminium, pentaaminium, hexaaminium (and generally, polyaminium) compounds.

The anion can be any of the anions known in the art. Some particularly preferred examples of anions include $SbF_6^-$, the halides (e.g., Cl–, Br–, I—), $ClO_4^-$, $CH_3SO_3^-$, $C_2F_5SO_3^-$, $C_4F_9SO_3^-$, $N(SO_2CF_3)_2^-$, $N(SO_2C_2F_5)_2^-$, $N(SO_2C_3F_7)_2^-$, $N(SO_2C_4F_9)_2^-$, and $C(SO_2CF_3)_3^-$.

In a particular embodiment, the invention is directed to a curable liquid formulation which includes (i) one or more near-infrared absorbing triphenylamine-based dyes; and (ii) one or more casting solvents, wherein the triphenylamine-based dyes preferably have the generic formula (1) and/or (4), and wherein at least a portion of the dye molecules have at least two crosslinkable groups (i.e., crosslinkable among dye molecules) per dye molecule. For example, for dyes of formula (1), at least two of $R_1$, $R_2$, $R_3$, $R_4$, $R_5$, and $R_6$ contain one or more crosslinkable groups, and for dyes of formula (4), at least two of $R_1$, $R_2$, $R_3$, $R_4R_5$, $R_6$, $R_7$, and $R_8$ contain one or more crosslinkable groups. The crosslinkable group can be any suitable group capable of crosslinking among dye molecules, as described above (e.g., epoxide groups and hydroxy groups).

The one or more crosslinkable polymers can be any of the polymers known in the art which can be crosslinked by any of the numerous means known in the art (e.g., by chemical, thermal, and/or radiative curing methods). The polymers can be homopolymers, copolymers, terpolymers, or higher order polymers. The crosslinkable polymers are preferably suitable for forming a solid sacrificial or protective layer (particularly, a thin film) on a microelectronic substrate. Some classes of such polymers include polymer compositions typically used in anti-reflective coatings (and particularly BARC layers), SITH-based polymers and ROMP polymer systems. The crosslinkable polymers are also preferably not adversely reactive with the dyes contemplated herein.

In one embodiment, at least one of the one or more crosslinkable polymers contains reactive cyclic ether groups (e.g., oxacyclobutyl or epoxide groups) and/or hydroxy-containing groups for at least a portion of the polymeric units. In another embodiment, at least one of the one or more crosslinkable polymers contains one or more types of acrylate or methacrylate units for at least a portion of the polymeric units. The acrylate or methacrylate can be either in the acid or ester form, wherein the ester form can be an ester of any of the hydrocarbon groups (optionally heteroatom-substituted)

described above. The one or more acrylate or methacrylate units contemplated herein can be conveniently expressed by the formulae:

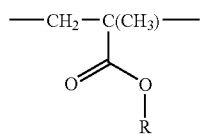

(5)

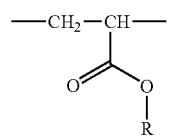

(6)

In formulae (5) and (6), R represents any of the hydrocarbon groups described above, optionally heteroatom-derivatized with one or more O, N, or S atoms. In a particular embodiment, at least one of the acrylate or methacrylate units in the polymer possesses R as a reactive cyclic ether-containing (e.g., epoxide-containing) group or hydroxy-containing group. In another embodiment, at least one of the acrylate or methacrylate units in the polymer contains a monocyclic ring or polycyclic ring system, either of which may be saturated or unsaturated, or aliphatic or aromatic. The monocyclic ring or polycyclic ring system preferably includes one or more reactive cyclic ether or hydroxy-containing groups. Some particular polycyclic ring systems considered herein include nobornyl and adamantyl groups.

In another embodiment, at least one of the one or more crosslinkable polymers contains polymerized vinyl hydrocarbon units for at least a portion of the polymeric units (e.g., polypropylene, polystyrene, and the like). The one or more vinyl hydrocarbon units contemplated herein can be conveniently expressed by the formulae:

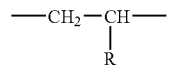

(7)

In formula (7), R represents any of the hydrocarbon groups described above, optionally heteroatom-derivatized with one or more O, N, or S atoms. In a particular embodiment, at least one of the vinyl hydrocarbon units in the polymer possesses R as a reactive cyclic ether-containing (e.g., epoxide-containing) or hydroxy-containing group. In another embodiment, at least one of the vinyl hydrocarbon units in the polymer contains a monocyclic ring or polycyclic ring system, either of which may be saturated or unsaturated, or aliphatic or aromatic.

Some particularly preferred polymeric units include the following:

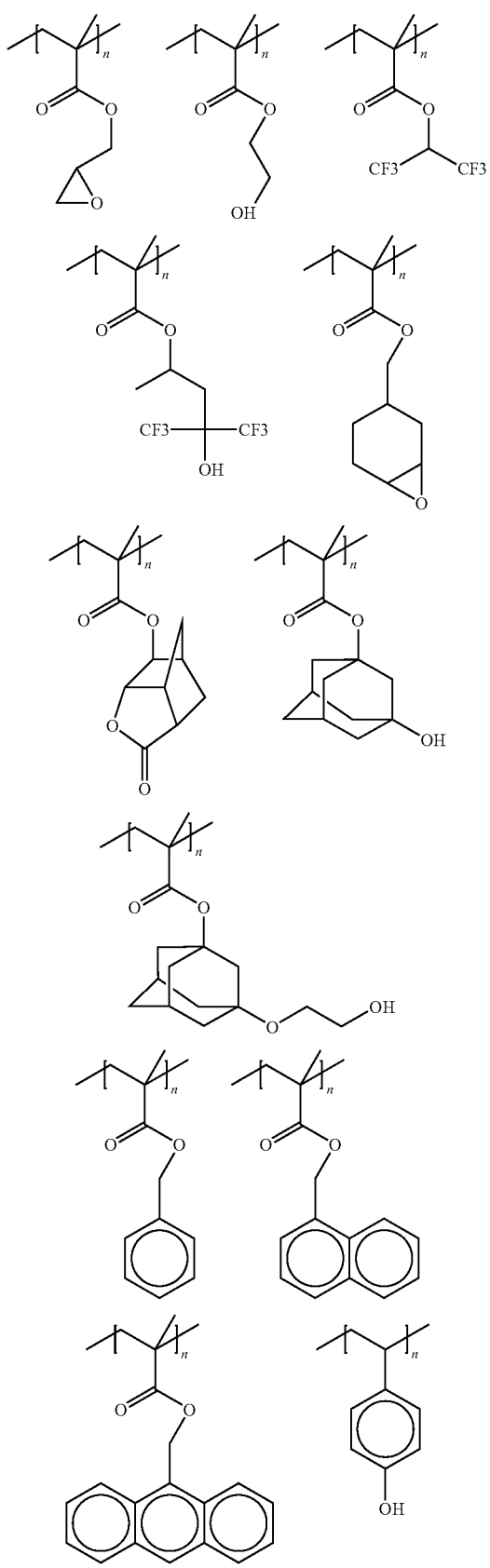

-continued

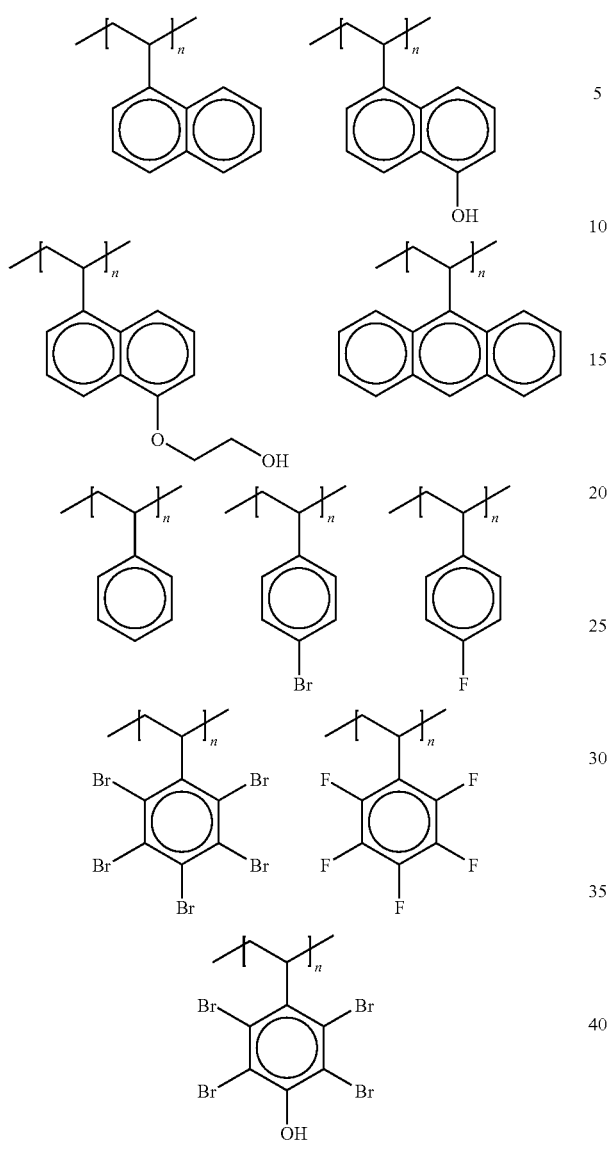

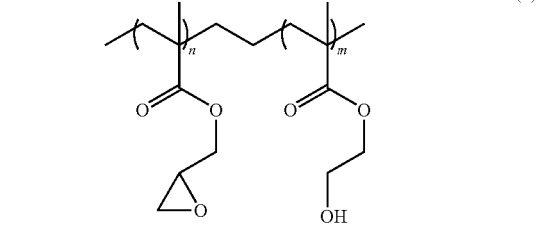

(8)

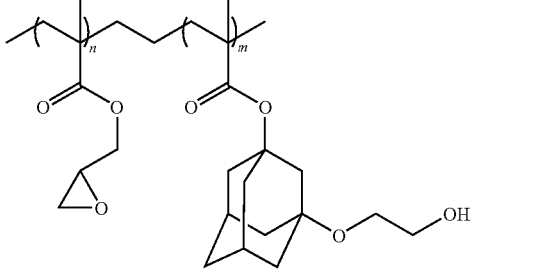

(9)

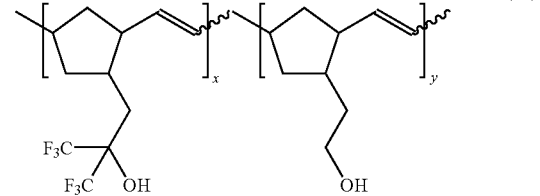

(10)

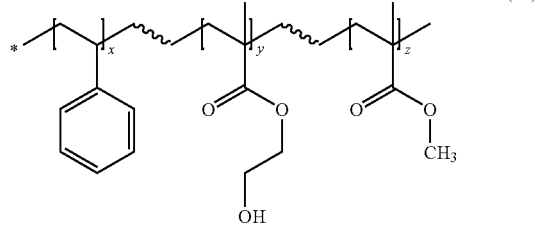

(11)

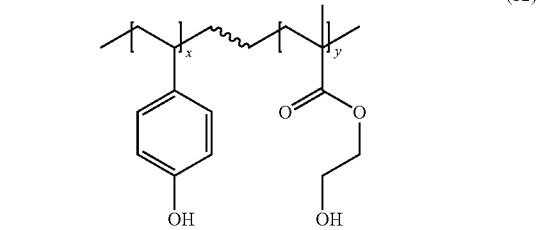

(12)

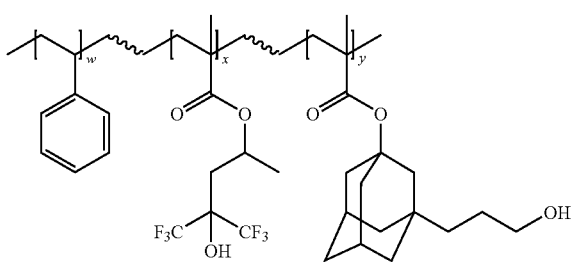

(13)

The collection of chemical structures given above can indicate individual polymeric units (i.e., where n is a value of at least 1) which can be combined with other polymeric units, and particularly other polymeric units given in the collection of chemical structures above. In one embodiment, the polymers are homopolymers of any of the polymeric units given above. In another embodiment, the polymers are copolymers of any of the polymeric units exemplified above. In another embodiment the polymers are terpolymers or higher-order polymers of any of the polymeric units exemplified above. The copolymers, terpolymers, and higher order polymers can be, for example, block copolymers, graft copolymers, or random copolymers. A combination (i.e., mixture) of polymers, copolymers, terpolymers, as well as combinations amongst these, are also contemplated.

Some particularly preferred crosslinkable copolymers include those of the following chemical structures:

In chemical formulae 8-13 above, subscripts n, m, w, x, y, and z are each independently at least 1, 2, 3, or 4 and up to, for example, 10, 15, 20, 25, 30, 40, 50, 60, 70, 80, 90, 100, 150, 200, 250, 500, 1000, or higher. Alternatively, these subscripts can be taken as molar percentages, such that, for example, n+m=100. In this mode, either n or m can be, for example, 1, 2, 5, 10, 15, 20, 25, 30, 35, 40, 45, or 50 molar percent, or a range therebetween.

The one or more casting solvents are any solvents known in the art which effectively solubilize the dye. The solvent may be any solvent conventionally used with spin coat methods which otherwise does not have any excessively adverse impact on the performance of the NIR absorbing layer composition. Some examples of solvents include 3-pentanone, Methyl Isobutyl Ketone (MIBK), Propylene glycol methyl ether (1-Methoxy-2-propanol), Methyl Cellosolve (2-Methoxyethanol), Butyl Acetate, 2-ethoxyethanol, Propylene glycol methyl ether acetate (PGMEA), Propylene glycol propyl ether (1-Propoxy-2-propanol, Dowanol PnP), 4-heptanone, 3-heptanone, 2-heptanone, N,N-dimethylformamide, Anisole, Ethyl Lactate, Cyclohexanone, Cellosolve Acetate (Ethylene glycol ethyl ether acetate), N,N-dimethylacetamide, Diglyme (2-methoxy ethyl ether), Ethyl 3-ethoxy propionate, Dimethyl Sulfoxide, Di (propylene glycol) methyl ether (DOWANOL), Di (ethylene glycol) methyl ether, Diethylmalonate, 2-(2-butoxy ethoxy ethanol) (DEGBE) and gamma-butyrolactone.

The amount of solvent in the composition for application to a substrate is typically selected such that a solids content of about 1-20 wt. % is achieved. Higher solids content formulations will generally yield thicker coating layers. The compositions of the present disclosure may further contain minor amounts of auxiliary components (e.g., base additives, surfactants, etc.) as may be known in the art.

The liquid formulations can optionally contain one or more crosslinking agents (i.e., "crosslinking component") for facilitating the hardening (curing) step. The one or more crosslinking agents are any molecules or polymers which function by interlinking functional groups between the dye and crosslinkable polymer, and/or between dye molecules, and/or between different polymer chains. For example, a diol, triol, tetrol or higher polyol compound or polymer is effective for crosslinking of epoxidized polymers, or alternatively, a di-epoxy, tri-epoxy, or poly-epoxy compound or polymer is effective for crosslinking of hydroxy-, amino-, or epoxy-containing polymers. The crosslinking component is typically a crosslinker that can be reacted with all the polymer components present in the antireflective coating composition in a manner which is catalyzed by generated acid and/or by heating. Generally, the crosslinking component used in the antireflective coating compositions of the invention is any suitable crosslinking agent known in the negative photoresist art which is otherwise compatible with the other selected components of the composition. The crosslinking agents typically act to crosslink the polymer component in the presence of a generated acid. Typical crosslinking agents are glycoluril compounds such as tetramethoxymethyl glycoluril, methylpropyltetramethoxymethyl glycoluril, and methylphenyltetramethoxymethyl glycoluril, available under the POWDER-LINK® trademark from Cytec Industries. Other possible crosslinking agents include: 2,6-bis(hydroxymethyl)-p-cresol compounds such as those disclosed in Japanese Laid-Open Patent Application (Kokai) No. 1-293339, etherified amino resins, for example, methylated or butylated melamine resins (N-methoxymethyl- or N-butoxymethyl-melamine respectively), and methylated/butylated glycolurils, for example as disclosed in Canadian Patent No. 1 204 547. Other crosslinking agents such as bis-epoxies or bis-phenols (e.g., bisphenol-A) may also be used. Combinations of crosslinking agents may be preferred in some embodiments.

Some particular examples of inter-polymer or inter-dye crosslinking agents are given as follows:

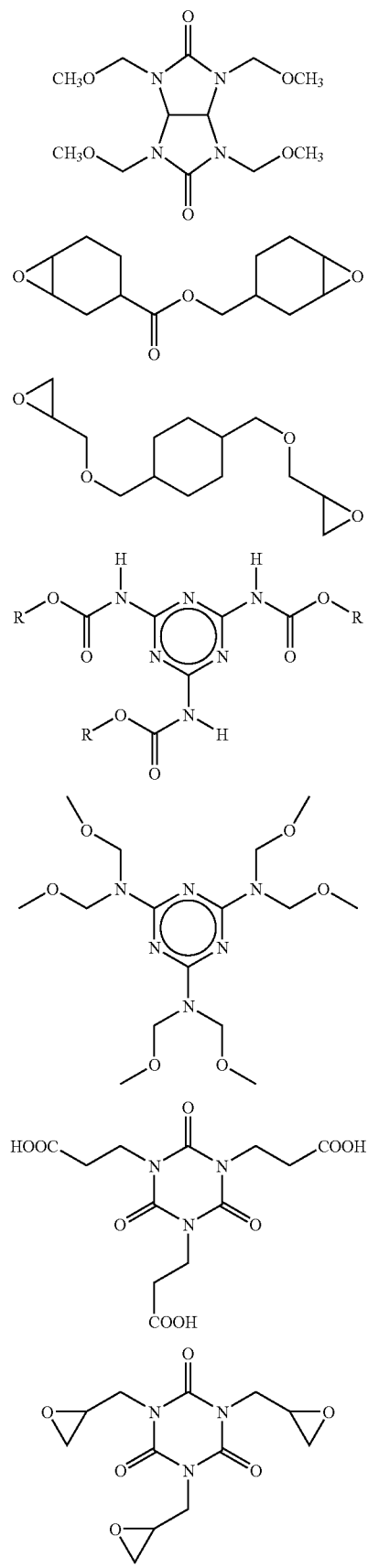

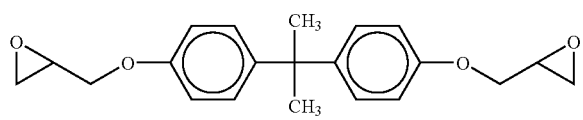

The liquid formulations can optionally contain one or more acid generators for facilitating the hardening (curing) step. The acid generator is typically a thermal acid generator compound that liberates acid upon thermal treatment. Some examples of thermal acid generators include 2,4,4,6-tetrabromocyclohexadienone, benzoin tosylate, 2-nitrophenyl tosylate, and other alkyl esters of organic sulfonic acids. Compounds that generate a sulfonic acid group upon activation are generally suitable. Other suitable thermally activated acid generators are described in U.S. Pat. Nos. 5,886,102 and 5,939,236. If desired, a radiation-sensitive acid generator may be employed as an alternative to a thermally activated acid generator or in combination with a thermally activated acid generator. Examples of suitable radiation-sensitive acid generators are also described in U.S. Pat. Nos. 5,886,102 and 5,939,236. Other radiation-sensitive acid generators known in the resist art may also be used as long as they are compatible with the other components of the NIR absorbing composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line). In some embodiments it is preferable to use a mixture of acid generators.

Some particular examples of thermal acid generators are given as follows:

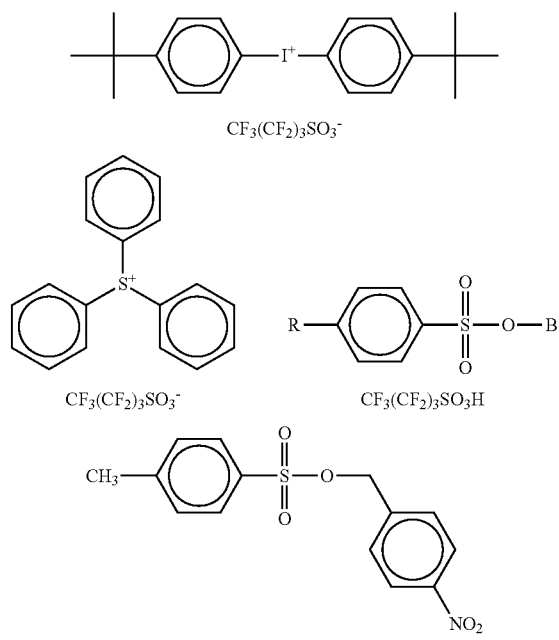

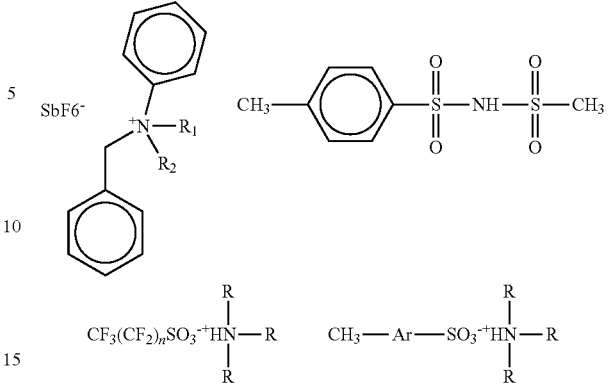

The liquid formulations can optionally contain one or more surfactants. The surfactants can be included to, for example, provide the NIR absorbing film with improved film thickness uniformity across the wafer by acting as leveling agents. When used as wetting agents, surfactants can also reduce defect formation arising from inadequate substrate surface wetting during the spin coating of the NIR absorbing film.

In one embodiment, the one or more surfactants includes an ionic surfactant, which can be either an anionic, cationic, or zwitterionic surfactant. Some examples of anionic surfactants include the fluorinated and non-fluorinated carboxylates (e.g., perfluorooctanoates, perfluorodecanoates, perfluorotetradecanoates, octanoates, decanoates, tetradecanoates, fatty acid salts), the fluorinated and non-fluorinated sulfonates (e.g., perfluorooctanesulfonates, perfluorodecanesulfonates, octanesulfonates, decanesulfonates, alkyl benzene sulfonate), the fluorinated and non-fluorinated sulfate salts (e.g., dodecyl sulfates, lauryl sulfates, sodium lauryl ether sulfate, perfluorododecyl sulfate, and other alkyl and perfluoroalkyl sulfate salts). The majority of cationic surfactants contain a positively charged nitrogen atom, such as found in the quaternary ammonium surfactants, e.g., the alkyltrimethylammonium salts wherein the alkyl group typically possesses at least four carbon atoms and up to 14, 16, 18, 20, 22, 24, or 26 carbon atoms. Some examples of cationic surfactants include the quaternary ammonium surfactants (e.g., cetyl trimethylammonium bromide, benzalkonium chloride, and benzethonium chloride), the pyridinium surfactants (e.g., cetylpyridinium chloride), and the polyethoxylated amine surfactants (e.g., polyethoxylated tallow amine). Some examples of zwitterionic surfactants include the betaines (e.g., dodecyl betaine, cocamidopropyl betaine) and the glycinates. Some examples of non-ionic surfactants include the alkyl polyethyleneoxides, alkylphenol polyethyleneoxides, copolymers of polyethyleneoxide and polypropyleneoxide (e.g., poloxamers and poloxamines), alkyl polyglucosides (e.g., octyl glucoside, decyl maltoside), fatty alcohols, (e.g., cetyl alcohol, oleyl alcohol), fatty amides (e.g., cocamide MEA, cocamide DEA), and polysorbates (e.g., polysorbate 20, polysorbate 40, polysorbate 60, polysorbate 80).

The liquid formulations can alternatively have the near-infrared absorbing triphenylamine-based dye linked to a crosslinkable polymer and/or an inter-polymer (inter-dye) crosslinking agent described above.

The liquid formulation described above undergoes a crosslinking step by any of the numerous means known in the art (e.g., by chemical, thermal, and/or radiative curing methods) in order to produce a solid near-infrared absorbing film. Generally, substantially all of the casting solvent is removed during the curing process. The film can have any suitable thickness. The thickness of the film is generally limited by the application space. In different embodiments, the film has a thickness of at least, or at most, 1 nm, 10 nm, 20 nm, 30 nm, 40 nm, 50 nm, 100 nm, 250 nm, 400 nm, 500 nm, 750 nm, 1 µm, 2 µm, 5 µm, 10 µm, 50 µm, or 100 µm, or any particular range of thicknesses bounded by any two of the foregoing values. In a preferred embodiment, the NIR-absorbing film has a thickness no more than, and preferably, less than, 1000 nm. A particularly preferred film thickness is in the range of 30-400 nm. The NIR-absorbing film preferably has a k value greater than 0.15 at its absorption maximum within a 600-1200 nm range. The NIR-absorbing film more preferably has a k value greater than 0.45, and even more preferably, greater than 0.7 in this range.

Particularly contemplated herein is a microelectronic (i.e., semiconductor) substrate having on its surface the near-infrared absorbing film described above. The NIR-absorbing film can be coated onto the microelectronic substrate (or other surface) by any of the techniques known in the art for this purpose. In a particular embodiment, the NIR-absorbing film is applied by a solvent casting method and cured. It is desirable to have the NIR-absorbing film absorb a significant portion (such as, at least 30%) or substantial portion (preferably, at least 50%, 60%, 70%, 80%, or 90%) of the NIR light of the leveling signal passing through the film stack as reflected from the substructures. A greater absorption of the reflected light can be achieved, if desired, by coating a thicker NIR-absorbing film or engineering the NIR-absorbing film to have a relatively higher k value through a broad range of NIR spectrum.

In a particular embodiment, a microelectronic substrate covered by the NIR-absorbing film, as described above, further contains a resist (e.g., photoresist) film covering the NIR-absorbing film (i.e., the NIR-absorbing film is between the microelectronic substrate and photoresist film). The photoresist film can be any of the positive or negative photoresist films known in the art. In one embodiment, the resist directly covers the NIR-absorbing film (i.e., the resist is bonded to or in contact with the NIR-absorbing film). In another embodiment, the resist does not directly cover (i.e., the resist is not bonded to or in contact with) the NIR-absorbing film by having one or more other films between the resist and NIR-absorbing film. For example, any one or more layers of other coatings may also be present between the microelectronic substrate and NIR-absorbing film or between the NIR-absorbing film and photoresist. In another embodiment, the NIR-absorbing film described above includes a photoimageable component such that the NIR-absorbing film is also a photoresist film.

In addition, one or more other films can cover the resist layer. An example of a type of film used for covering the resist layer is an immersion top coat film. An immersion top coat film typically functions to prevent resist components from leaching into an immersion medium, such as water.

To provide a proper vertical alignment, the focus leveling sensor light is emitted from a broad band NIR source, and this impinges upon, and is reflected from, the microelectronic structure. The reflected light is then detected by a leveling photosensor followed by an auto focus mechanism which adjusts the z height to place the photoresist layer within the imaging focal plane. Any NIR light reflected from substructures will interfere with the surface reflected light and cause a wrong adjustment in z height. The incorporation of the NIR-absorbing film, as described herein, advantageously substantially minimizes or even removes reflected or diffracted infrared wavelengths emanating from buried topography of the underlying microelectronic substrate. Accordingly, a much more accurate sensing of the top wafer surface is made possible. The improved sensing of the top surface allows for a more accurate placement of surface features or surface operations (e.g., patterning of a photoresist).

In the microelectronic structure, the solid near-infrared absorbing film typically functions as an anti-reflective coating, such as a bottom anti-reflective (BARC) coating, a planarization underlayer (UL), or an extra interlayer. Since both BARC and UL layers usually require significant absorption at the imaging wavelength and/or etch resistance toward oxygen containing plasma, it is preferable to have an aromatic and/or polycyclic moiety in the crosslinkable polymer described above.

In another aspect, the invention is directed to a method for patterning a photoresist layer coated on a microelectronic substrate having the above NIR-absorbing film between the microelectronic substrate and photoresist film. The NIR-absorbing layer provides sufficient absorption of the NIR light passing through it. The method includes aligning and focusing a focal plane position of the photoresist film by sensing near-infrared emissions reflected from the microelectronic structure and adjusting relative positions of an exposure device and microelectronic substrate based on sensed emissions. After the photoresist film has been aligned and adjusted, the photoresist layer is patterned by being exposed to a patterning exposure beam. The method can also include numerous other steps commonly employed in the art of microelectronic or semiconductor processing. For example, after patterning of the photoresist, the photoresist is typically developed by any of the methods known in the art.

Examples have been set forth below for the purpose of illustration and to describe certain specific embodiments of the invention. However, the scope of this invention is not to be in any way limited by the examples set forth herein.

EXAMPLE 1

Synthesis of tris(4-aminophenyl)amine

Compound 2 in FIG. 1

Into a 500 mL flask were placed 10.0 g (26.3 mmol) of tris(4-nitrophenylamine) (Compound 1, obtained from Sigma-Aldrich) and 42 g tin granules were placed. 85 mL ethanol (EtOH), 60 mL water and 50 mL hydrochloric acid (37%) were added and the mixture refluxed for 16 hours. The hot mixture was decanted from the remaining tin by pouring it into a large beaker. Cooling to room temperature (i.e., within about 15-25° C.) led to the precipitation of off-white crystals, which were filtered off. The crystals were redissolved in hot water and the resulting clear solution filtered. A large excess of sodium hydroxide (50% solution) was added. The white precipitate was filtered, thoroughly washed with water, and then dried by vacuum. Yield: 7.3 g (25.2 mmol; 95.7%).

EXAMPLE 2

Synthesis of tris(4-acetamidophenyl)amine

Compound 3 in FIG. 1

6.7 g (23.1 mmol) of compound 2 was dissolved in 100 mL dry dimethylformamide (DMF). To this was added 10.1 g (100 mmol; 4.3 eq) of dry triethylamine. The flask was ice-cooled and then acetyl chloride (7.85 g; 7.1 mL; 100 mmol;

4.3 eq) was slowly added via an addition funnel, which led to precipitation of triethylammonium hydrochloride. The mixture was stirred for 1 hour, and then filtered. The filtrate was submerged into 500 mL ice-water to induce precipitation of the product. The tan precipitate was filtered, washed with water, and dried. Yield: 8.4 g (20.2 mmol; 87.4%).

EXAMPLE 3

Synthesis of tris(4-[N-ethylamino]phenyl)amine

Compound 4 in FIG. 1

To 4 g LiAlH$_4$ in 50 mL dry tetrahydrofuran (THF) was slowly added compound 3 (5.95 g; 14.3 mmol) at room temperature. The mixture was refluxed overnight under nitrogen, then cooled down to room temperature (r.t.) and carefully hydrolyzed by subsequent addition of water and 10% NaOH solution. The inorganic precipitate was filtered and discarded, and the remaining THF solution was dried and evaporated to give 2.3 g (6.15 mmol; 43%) of compound 4.

EXAMPLE 4

Synthesis of tris(4-[N-ethyl, N-glycidylamino]phenyl)amine

Compound 5 in FIG. 1

0.5 g (1.3 mmol) of compound 4 was dissolved in 20 mL epichlorohydrin, then 1 g K$_2$CO$_3$ was added and the mixture stirred at 110° C. under N$_2$ for 16 hours. After cooling the mixture to room temperature, acetone was added, and the mixture filtered. Acetone was removed through distillation, and then some dimethylsulfoxide (DMSO) was added. Excess epichlorohydrin was removed by vacuum and as much DMSO as possible was removed by application of heat. Yield was nearly 100%.

EXAMPLE 5

Synthesis of monomethyl succinate

Figure 2:
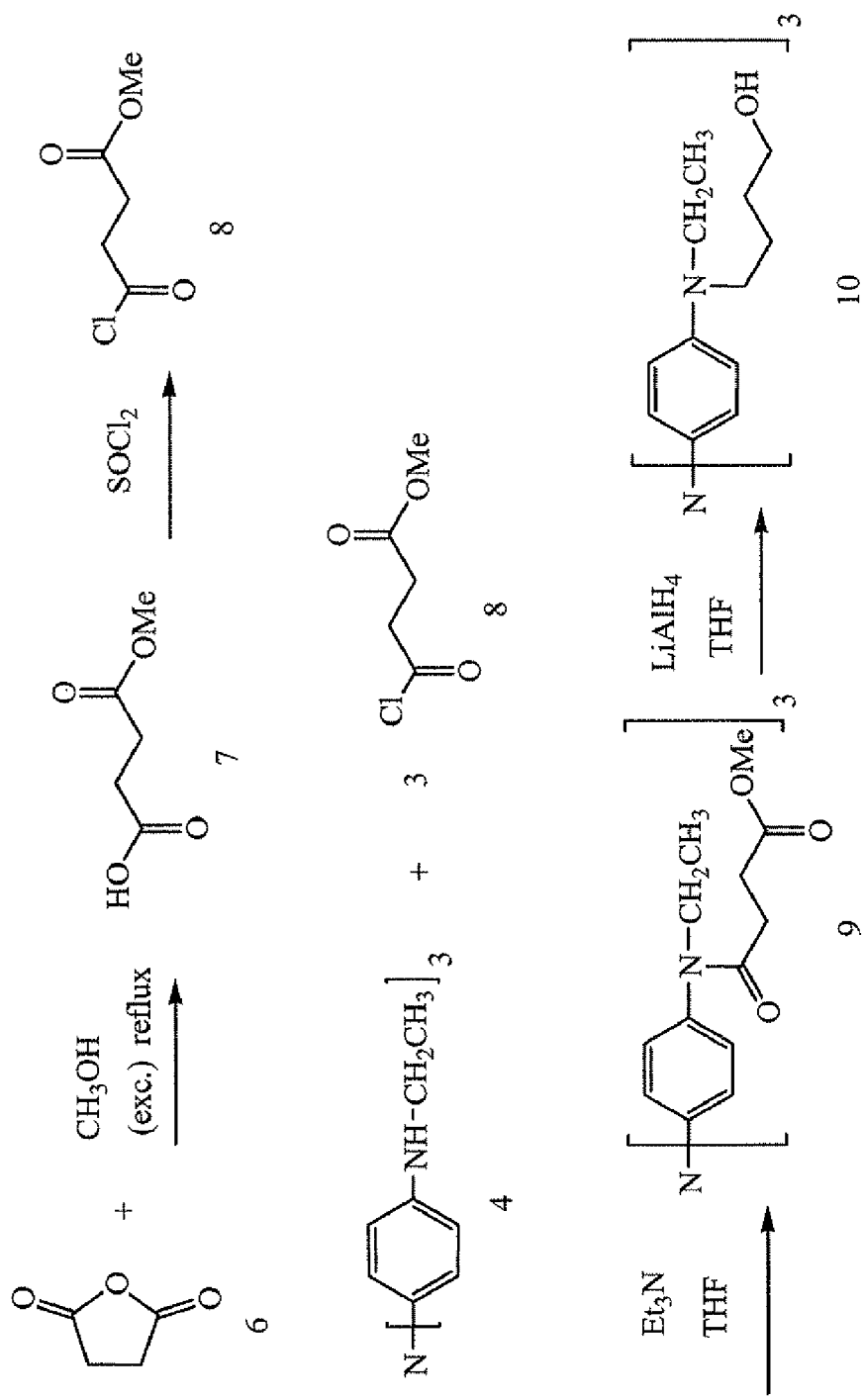
FIG. 2 is a general schematic showing the synthesis of tris(4-[N-ethyl-N-(4-hydroxybutyl)amino]phenyl)amine (10), an exemplary dye of the invention.

Compound 7 in FIG. 2

20.33 g (0.2 mol) of succinic anhydride (compound 6) was dissolved in 150 mL methanol. After addition of 1 drop of DMF, the mixture was refluxed for 6 hours, then excess methanol (MeOH) was evaporated and the residual mass dried in vaccum. Yield: 22.1 g (0.17 mol; 82.5%).

EXAMPLE 6

Synthesis of methyl succinyl chloride

Compound 8 in FIG. 2

22.1 g (0.17 mol) of monomethyl succinate (compound 7) was dissolved in 50 mL SOCl$_2$ and the resulting solution heated to 100° C. for 30 minutes. Subsequently, the majority of the SOCl$_2$ was removed by distillation. The mixture was cooled down to room temperature and a vacuum applied for 16 hours. The product was then distilled. Yield: 15.5 g (0.1 mol; 60.6%).

EXAMPLE 7

Synthesis of tris(4-[N-ethyl-N-(4-methoxycarbonyl-propionamido)]phenyl)amine

Compound 9 in FIG. 2

7.55 g (20.2 mmol) of compound 4 was dissolved in 150 mL dry THF and 7.0 g (69 mmol, 3.4 eq) of dry triethylamine was added. Subsequently, 10.4 g (69 mmol, 3.4 eq) of compound 8 was added drop-wise. The mixture was stirred at room temperature for 1 hour, before being filtered and evaporated. The crude product was used without further purification for the synthesis of compound 10.

EXAMPLE 8

Synthesis of tris(4-[N-ethyl-N-(4-hydroxybutyl)amino]phenyl)amine

Compound 10 in FIG. 2

The crude compound 9 was dissolved in 150 mL of dry THF and a large molar excess of LiAlH$_4$ was added. The mixture was refluxed overnight under N$_2$, then cooled to 0° C. and carefully hydrolyzed by the subsequent addition of water and 10% NaOH solution. After filtration and drying, THF was evaporated and the product was further purified by dissolving it in methylene chloride and extraction with water (2×). Methylene chloride was dried with MgSO$_4$ and then removed by evaporation. The product was dried by vacuum for 36 hours. Yield: 5.05 g (42.4% of compound 4).

EXAMPLE 9

Synthesis of N,N-dibutyl-4-bromoaniline

1-Bromobutane (41.1 g, 300 mmol), 4-bromoaniline (17.2 g, 100 mmol) and KOH (16.8 g, 300 mmol) were heated at reflux under nitrogen gas for about 18 hours. After cooling, the mixture was partitioned between water and hexane and the organic layer washed with water followed by brine. After drying over MgSO$_4$ and filtering, the solvent was evaporated and the mixture distilled under reduced pressure. Distillate fractions collected between 25-100° C. and pressure of 360-210 mTorr contained a mixture of products and starting material. The fractions collected at 100-107° C. and 200 mTorr pressure afforded 12.1 g (43%) of pure product.

EXAMPLE 10

Synthesis of tetrakis-[N,N,N,N',N'-(p-(N'',N''-di-(n-butyl)amino)phenyl)]phenylenediamine

LT-535

N,N-dibutyl-4-bromoaniline from Example 9 (5.62 g, 19.8 mmol), 1,4-phenylenediamine (520 mg, 4.8 mmol), sodium t-butoxide (2.12 g, 22 mmol), Pd$_2$dba$_3$ (90 mg), 2-dicyclohexylphosphino-2',4',6'-triisopropylbiphenyl (250 mg, 0.52 mmol) and dioxane (20 mL) were heated at 100° C. for about 18 hours. After cooling, the mixture was partitioned between water and ether. The aqueous phase was extracted one more time with ether and the combined organics washed with 1 M aqueous ammonium chloride and dried over MgSO$_4$. After filtration and evaporation of ether, the product was chromatographed on silica gel. Two fractions (red and green) were obtained by eluting with hexane with gradually increasing concentration of ethylacetate from 0 to 5% v/v. The green fraction was dissolved in ether and briefly shaken with sodium hydrosulfite solution to convert it back to reddish material. Without being bound by any theory, it appears that the butyl side chains cause more facile oxidation of the product, thereby affording green-colored radical species. Radical cation(s) can be formed by treating the product with, for example, AgNH(SO$_2$CF$_3$)$_2$ in acetone for 2 hours at 45° C. The product is believed to have the following structure (or a mixture of structures):

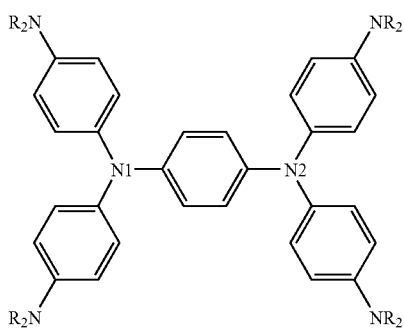

where R=n-butyl, and wherein the molecule contains one or more radical cations (typically, one or both of N1 and N2 are radical cations), wherein the counteranion can be a suitable anion, such as N(SO$_2$CF$_3$)$_2^-$.

EXAMPLE 11

Synthesis of copolymer of 3-(2-hydroxyethoxy)-1-adamantyl methacrylate and glycidyl methacrylate (PHEADMAGCMA (20/80))

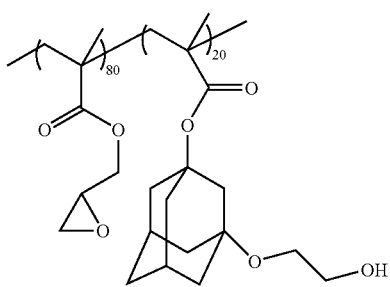

To a round bottom flask equipped with condenser, thermometer, an argon inlet and a magnetic stirrer bar, the following were added: 3-(2-hydroxyethoxy)-1-adamantyl methacrylate (HEADMA) monomer (3.365 g, 0.012 mole), glycidyl methacrylate (GCMA) monomer (6.823 g, 0.048 mole), AIBN (0.394 g, 4% of total moles of monomers), and ~40 g of THF. The reaction mixture was stirred at room temperature and bubbled with argon (Ar) flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at 40° C. overnight. The molecular weight (MW) was determined to be about 23,050 g/mol as determined by gel permeation chromatography (GPC) using a Waters model 150-C in THF at 28° C. calibrated with polystyrene standards.

EXAMPLE 12

Synthesis of copolymers of 3-(2-hydroxyethoxy)-1-adamantyl methacrylate and glycidyl methacrylate (PHEADMAGCMA (50/50)) and (PHEADMAGCMA (35/65))

The two copolymers were synthesized with the same procedure as described in Example 11. The amounts of the monomers used in the reaction are shown in Table 1 below:

TABLE 1

| Polymer | HEADMA | GCMA |
| --- | --- | --- |
| PHEADMAGCMA (50/50) | 8.412 g (0.03 mole) | 4.265 g (0.03 mole) |
| PHEADMAGCMA (35/65) | 5.89 g (0.021 mole) | 5.54 g (0.039 mole) |

The molecular weights, as determined by gel permeation chromatography (GPC) using a Waters model 150-C in THF at 28° C. calibrated with polystyrene standards, are shown in the following Table 2 below.

TABLE 2

| Sample | Polymer Composition | MW |
| --- | --- | --- |
| 1 | PHEADMAGCMA (50/50) | 36,734 |
| 2 | PHEADMAGCMA (35/65) | 30,386 |

EXAMPLE 13

Synthesis of copolymer of 5-methacryloyloxy-2,6-norbornanecarbo-gamma-lactone and glycidyl methacrylate (PNLMGCMA (35/65))

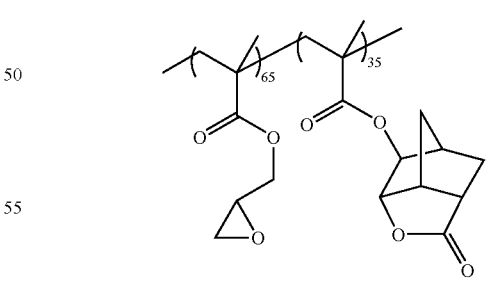

PNLMGCMA (35/65)

To a round bottom flask equipped with condenser, thermometer, an argon inlet and a magnetic stirrer bar, the following were added: 5-methacryloyloxy-2,6-norbornanecarbo-gamma-lactone (NLM) monomer (5.84 g, 0.0263 mole), glycidyl methacrylate (GCMA) monomer (6.93 g, 0.0488 mole), AIBN (0.492 g, 4% of total moles of monomers), and ~50 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at 40° C. overnight. The molecular weight (MW) was determined to be about 19,291 g/mol as determined by gel permeation chromatography (GPC) using a Waters model 150-C in THF at 28° C. calibrated with polystyrene standards.

EXAMPLE 14

Synthesis of homopolymer of glycidyl methacrylate (PGCMA)

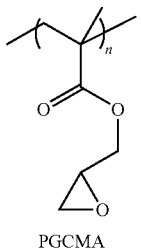

PGCMA

To a round bottom flask equipped with condenser, thermometer, an argon inlet and a magnetic stirrer bar, the following were added: glycidyl methacrylate (GCMA) monomer (11.372 g, 0.08 mole), AIBN (0.525 g, 4% of total moles of monomers), and ~40 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at room temperature overnight. The molecular weight (MW) was determined to be about 18,768 g/mol as determined by gel permeation chromatography (GPC) using a Waters model 150-C in THF at 28° C. calibrated with polystyrene standards.

EXAMPLE 15

Synthesis of copolymer of 2-hydroxyethyl methacrylate and glycidyl methacrylate (PHEMAGCMA (35/65))

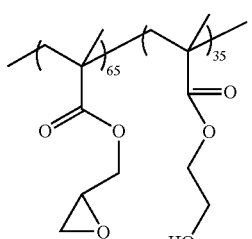

PHEMAGCMA (35/65)

To a round bottom flask equipped with condenser, thermometer, an argon inlet and a magnetic stirrer bar, the following were added: 2-hydroxyethyl methacrylate (HEMA) monomer (3.64 g, 0.028 mole), glycidyl methacrylate (GCMA) monomer (7.39 g, 0.052 mole), AIBN (0.525 g, 4% of total moles of monomers), and ~40 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at room temperature for three days. The molecular weight (MW) was determined to be about 25,028 g/mol as determined by gel permeation chromatography (GPC) using a Waters model 150-C in THF at 28° C. calibrated with polystyrene standards.

EXAMPLE 16

Synthesis of copolymer of 1,1,1,3,3,3-hexafluoroisopropyl acrylate and glycidyl methacrylate (PHFIPAGCMA (50/50))

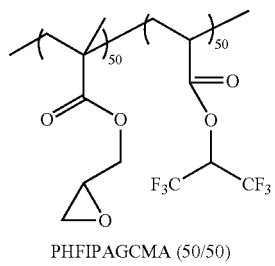

PHFIPAGCMA (50/50)

To a round bottom flask equipped with condenser, thermometer, an argon inlet and a magnetic stirrer bar, the following were added: 1,1,1,3,3,3-hexafluoroisopropyl acrylate (HFIPA) monomer (3.33 g, 0.015 mole), glycidyl methacrylate (GCMA) monomer (2.13 g, 0.015 mole), AIBN (0.197 g, 4% of total moles of monomers), and ~20 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was washed with hexane, and then dried by vacuum oven at room temperature overnight. The molecular weight (MW) was determined to be about 12,499 g/mol as determined by gel permeation chromatography (GPC) using a Waters model 150-C in THF at 28° C. calibrated with polystyrene standards.

EXAMPLE 17

Synthesis of copolymer of 1,1,1-trifluoro-2-(trifluoromethyl)-pentan-2-ol-4-yl methacrylate and glycidyl methacrylate (PIPRHFAMAGCMA (40/60))

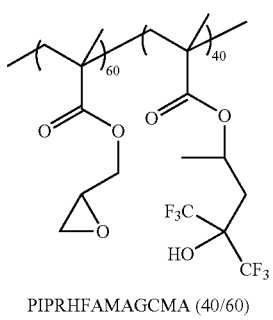

PIPRHFAMAGCMA (40/60)

To a round bottom flask equipped with condenser, thermometer, an argon inlet and a magnetic stirrer bar, the following were added: 1,1,1-trifluoro-2-(trifluoromethyl)-pentan-2-ol-4-yl methacrylate) (IPRHFAMA) monomer (5.88 g, 0.02 mole), glycidyl methacrylate (GCMA) monomer (4.26 g, 0.03 mole), AIBN (0.328 g, 4% of total moles of monomers), and ~35 g of THF. The reaction mixture was stirred at room temperature and bubbled with Ar flow for 45 minutes prior to turning on the heating mantle. The reaction was carried out overnight at 72° C. under Ar inert atmosphere. Then the reaction solution was cooled to room temperature and precipitated in hexane. The precipitated polymer was filtered and washed with hexane. The collected solid was dried by vacuum oven at room temperature overnight. The molecular weight (MW) was determined to be about 26,180 g/mol as determined by gel permeation chromatography (GPC) using a Waters model 150-C in THF at 28° C. calibrated with polystyrene standards.

EXAMPLE 18

Synthesis of copolymer of 1,1,1-trifluoro-2-(trifluoromethyl)-pentan-2-ol-4-yl methacrylate and glycidyl methacrylate (PiPrHFAMAGCMA (20/80))

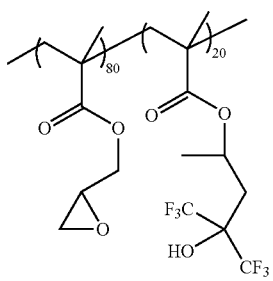

PiPrHFAMAGCMA (20/80)

To a round bottom flask equipped with condenser, thermometer, an argon inlet and a magnetic stirrer bar, the following were added: 1,1,1-trifluoro-2-(trifluoromethyl)-pentan-2-ol-4-yl methacrylate) (iPrHFAMA) monomer (4.41 g, 0.015 mole), glycidyl methacrylate (GCMA) monomer (8.53 g, 0.06 mole), AIBN (0.328 g, 4% of total moles of monomers), and ~40 g of THF. The reaction mixture was stirred at room temperature and bubbled with Ar flow for 45 minutes prior to turning on the heating mantle. The reaction was carried out overnight at 70° C. under Ar inert atmosphere. Then the reaction solution was cooled to room temperature and precipitated in hexane. The precipitated polymer was filtered and washed with hexane. The collected solid was dried by vacuum oven at room temperature overnight. The molecular weight (MW) was determined to be about 26,862 g/mol as determined by gel permeation chromatography (GPC) using a Waters model 150-C in THF at 28° C. calibrated with polystyrene standards.

EXAMPLE 19

Synthesis of homopolymer of 3,4-epoxycyclohexylmethyl methacrylate (PEPCHMMA)

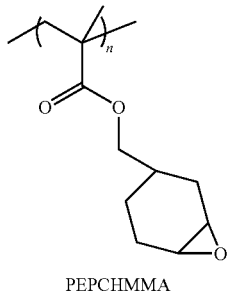

PEPCHMMA

To a round bottom flask equipped with condenser, thermometer, an argon inlet and a magnetic stirrer bar, the following were added: 3,4-epoxycyclohexylmethyl methacrylate (EPCHMMA) monomer (3.92 g, 0.02 mole), AIBN (0.131 g, 4% of total moles of monomers), and ~16 g of THF. The reaction mixture was stirred at room temperature and bubbled with Ar flow for 45 minutes prior to turning on the heating mantle. The reaction was carried out overnight at 70° C. under Ar inert atmosphere. Then the reaction solution was cooled to room temperature and precipitated in hexane. The precipitated polymer was filtered and washed with hexane. The solid collected was dried by vacuum oven at room temperature overnight. The molecular weight (MW) was determined to be about 27,828 g/mol as determined by gel perme-

EXAMPLE 20

Synthesis of copolymer of 3,4-epoxycyclohexylmethyl methacrylate and styrene (PEPCHMMAST (70/30))

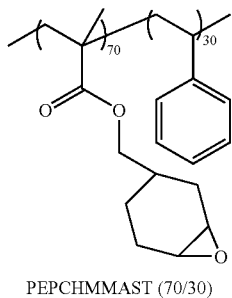

PEPCHMMAST (70/30)

To a round bottom flask equipped with condenser, thermometer, an argon inlet and a magnetic stirrer bar, the following were added: 3,4-epoxycyclohexylmethyl methacrylate (EPCHMMA) monomer (6.86 g, 0.035 mole), styrene (ST) monomer (1.56 g, 0.015 mole), AIBN (0.328 g, 4% of total moles of monomers), and ~44 g of THF. The reaction mixture was stirred at room temperature and bubbled with Ar flow for 45 minutes prior to turning on the heating mantle. The reaction was carried out overnight at 70° C. under Ar inert atmosphere. Then the reaction solution was cooled to room temperature and precipitated in hexane. The precipitated polymer was filtered and washed with hexane. The collected solid was dried by vacuum oven at room temperature overnight. The molecular weight (MW) was determined to be about 13,534 g/mol as determined by gel permeation chromatography (GPC) using a Waters model 150-C in THF at 28° C. calibrated with polystyrene standards.

EXAMPLE 21

Evaluation of NIR Dye with Leveling Sensor

Different amounts of Triaminic NIR dye Epolite 2057 (available from Epoline) were dissolved in cyclohexanone to obtain three solutions with solid content of 1.86 wt %, 3.71 wt % and 7.42 wt %, respectively. Each formulation was spun-coated with a spin speed of 1500 rpm on top of 12 inch wafer containing NIR reflective substructures under low temperature silicon oxide layer (LTO). The thickness of the NIR dye layer obtained after spin-coating was 50 nm for 1.86 wt %, ~100 nm for 3.71 wt % and 200 nm for 7.42 wt % respectively. The Z heights were measured with an ASML level sensor signal within an ASML 193 nm stepper, and the level data were plotted with IBM internally developed software. Each measurement contained 7 data points along each slit with 54 scans across field. Three key parameters were analyzed which include XMaxDev, Z Std Dev and Z rang. The level data obtained with the level sensor were then compared to the data obtained with AGILE (an ASML tool with mechanic air gauge) to measure the surface topography. Significant improvements were observed with the coating of NIR absorbing dye as shown in the Table 3 below.

TABLE 3

|  | XMaxDev | Z Std Dev | Z range |
|---|---|---|---|
| Control | 0.042 | 0.018 | 0.082 |
| ~50 nm Epolite 2057 | 0.036 | 0.011 | 0.055 |
| ~100 nm Epolite 2057 | 0.027 | 0.008 | 0.034 |
| ~300 nm Epolite 2057 | 0.024 | 0.007 | 0.032 |
| AGILE | 0.021 | 0.005 | 0.027 |

EXAMPLE 22

Evaluation of Blends of NIR Dyes and Epoxide Polymers with Leveling Sensor

Crosslinkable compositions containing blends of epoxide polymers and NIR dyes were formulated with 5 wt % (relative to polymer) in PGMEA and GBL mixed solvents as shown in Table 4 below.

TABLE 4

| Sample ID | Polymer (g) | TAG[1] (g) | PGMEA (g) | GBL (g) | Dye (g) |
|---|---|---|---|---|---|
| NIR 17 | PHEADMAGCMA(20/80): 0.4 | 0.02 | 14.26 | 0.12 | EPL2057: 0.2 |
| NIR 21 | PHEADMAGCMA(20/80): 0.3 | 0.015 | 14.295 | 0.09 | EPL2057: 0.3 |
| NIR 27 | PHEADMAGCMA(20/80): 0.12 | 0.006 | 3.778 | 0.036 | EPL2057: 0.06 |
| NIR 33 | PGCMA: 0.533 | 0.0267 | 15.7215 | 0.16 | EPL2057: 0.267 |
| NIR 38 | PGCMA: 0.533 | 0.0267 | 15.7215 | 0.16 | SDA6592[2]: 0.267 |
| NIR 39 | PGCMA: 0.533 | 0.0267 | 15.7215 | 0.16 | LT535(II)N2: 0.267 |
| NIR 42 | PGCMA: 0.355 PHFIPAGCMA (50/50): 0.178 | 0.0267 | 15.7215 | 0.16 | SDA6592: 0.267 |

[1]TAG is triethylammonium nanoflate thermal acid generator.
[2]SDA6592 is a triaminic dye available from H. W. Sands.

Each sample in Table 4 was evaluated with an ASML level sensor as described in Example 21 above. The level data obtained on these samples are listed in Table 5 below.

TABLE 5

|  | XMaxDev | Z Std Dev | Z range |
| --- | --- | --- | --- |
| Control | 0.042 | 0.018 | 0.082 |
| NIR 17 | 0.039 | 0.012 | 0.062 |
| NIR 21 | 0.037 | 0.012 | 0.059 |
| NIR 33 | 0.036 | 0.011 | 0.054 |
| NIR 38 | 0.042 | 0.016 | 0.075 |
| NIR 39 | 0.045 | 0.015 | 0.05 |
| NIR 42 | 0.041 | 0.016 | 0.075 |
| AGILE | 0.021 | 0.005 | 0.027 |

EXAMPLE 23

Lithographic Study of Resist Over NIR Absorbing Layer

NIR 17 as described in Example 22 above was spin-coated onto a 12 inch silicon wafer which had reflective substructures underneath LTO, and was post-apply baked (PAB) at about 185° C. for about 60 seconds. An Argon Fluoride (ArF) resist, AR2073, (from Japan synthetic Rubber Co.) was spin-coated on top of NIR 17. The resist was post-apply baked (PAB) at about 110° C. for about 60 seconds. The wafer was exposed to 193 nm wavelength light on an ASML stepper (0.93 NA, 0.84 outer and 0.64 inner s Annular illumination), at a dose from 20 to 30 millijoules/centimeter$^2$ (mj/cm$^2$) and focus from +0.1 to −0.1 micrometer. The wafer was then post-exposure baked (PEB) at about 100° C. for about 60 seconds. The film was then developed using a single puddle develop process for about 30 seconds with 0.263 N tetramethylammonium hydroxide (TMAH) developer (Moses Lake's AD-10). The critical dimensions (CD) of the developed photoresist patterns in several different locations within an exposure field were then measured with AMAT CDSEM tool, and then all fields within the entire wafer repeated the same measurement. CD data of each field location correspondent to focus and dose conditions was then used for exposure field best focus analysis. Best focus of each location within an exposure field was then generated. The best focus distribution within an exposure field was used to determine exposure field leveling performance. The focus error was reduced with NIR 17 in comparison to regular BARC.

While there have been shown and described what are presently believed to be the preferred embodiments of the present invention, those skilled in the art will realize that other and further embodiments can be made without departing from the spirit and scope of the invention described in this application, and this application includes all such modifications that are within the intended scope of the claims set forth herein.

What is claimed is:

1. A curable liquid formulation comprising:
   (i) one or more near-infrared absorbing triphenylamine-based dyes having the following generic formula:

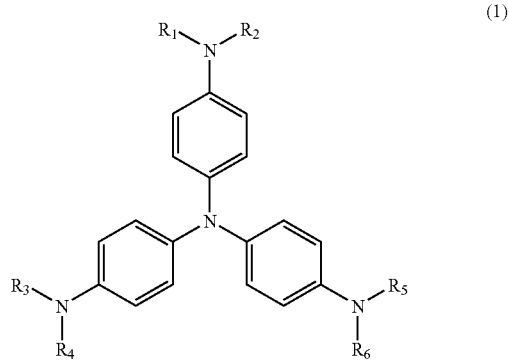

(1)

wherein at least one of $R_1$, $R_2$, $R_3$, $R_4$, $R_5$, and $R_6$ is selected from the group consisting of a cyclic ether group, a hydroxyl group, and a combination thereof and the remaining $R_1$, $R_2$, $R_3$, $R_4$, $R_5$, and $R_6$ independently represent a hydrogen atom or a hydrocarbon group containing at least one carbon atom, wherein a hydrocarbon group optionally includes one or more heteroatoms selected from nitrogen, oxygen, sulfur, and halide atoms; wherein one or more nitrogen atoms are cation radicals, and the one or more cation radicals are charge balanced by one or more anions;

(ii) one or more casting solvents; and
   (iii) an acid generator.

2. The liquid formulation of claim 1 further comprising one or more crosslinking agents.

3. The liquid formulation of claim 1 wherein the one or more triphenylamine-based dyes absorb electromagnetic radiation within a wavelength of 500 nm to 1200 nm.

4. The liquid formulation of claim 1 further comprising one or more crosslinkable polymers.

5. The liquid formulation of claim 4 wherein the one or more crosslinkable polymers include epoxide-containing groups.

6. The liquid formulation of claim 4 wherein the one or more crosslinkable polymers include aromatic groups.

7. The liquid formulation of claim 4 wherein the one or more crosslinkable polymers include polycyclic groups.

8. The liquid formulation of claim 1 wherein at least two of $R_1$, $R_2$, $R_3$, $R_4$, $R_5$, and $R_6$ contains said cyclic ether group, said hydroxyl group, or said combination thereof.

9. The liquid formulation of claim 1 wherein at least one of $R_1$, $R_2$, $R_3$, $R_4$, $R_5$, and $R_6$ is a cyclic ether group, and said cyclic ether group is selected from oxacyclobutyl and epoxide.

10. The liquid formulation of claim 1 wherein the one or more triphenylamine-based dyes have a formula within the following generic formula:

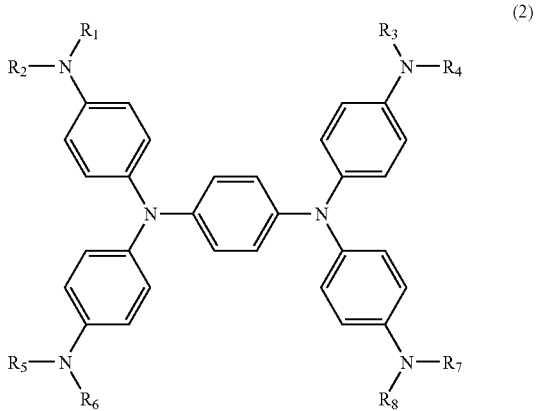

(2)

wherein at least one of $R_1$, $R_2$, $R_3$, $R_4$, $R_5$, and $R_6$ is selected from the group consisting of a cyclic ether group, a hydroxyl group, and a combination thereof and the remaining $R_1$, $R_2$, $R_3$, $R_4$, $R_5$, and $R_6$ independently represent a hydrogen atom or a hydrocarbon group containing at least one carbon atom, wherein a hydrocarbon group optionally includes one or more heteroatoms selected from nitrogen, oxygen, sulfur, and halide atoms; wherein one or more nitrogen atoms are cation radicals, and the one or more cation radicals are charge balanced by one or more anions.

11. A microelectronic structure comprising:
(a) a microelectronic substrate:
(b) a solid near-infrared absorbing film over the microelectronic substrate, wherein the near-infrared absorbing film includes one or more near-infrared absorbing triphenylamine-based dyes; and
(c) a photoresist film over the near-infrared absorbing film, wherein said at one or more near-infrared absorbing triphenylamine-based dyes have the following generic formula:

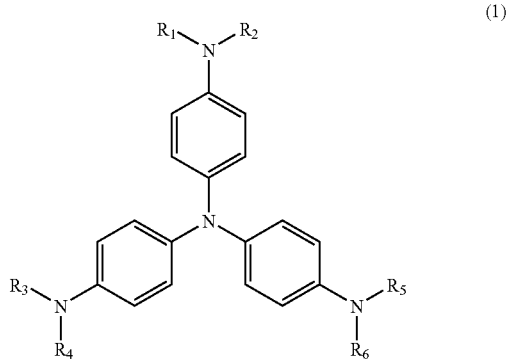

(1)

wherein at least one of $R_1$, $R_2$, $R_3$, $R_4$, $R_5$, and $R_6$ is selected from the group consisting of a cyclic ether group, a hydroxyl group, and a combination thereof and the remaining $R_1$, $R_2$, $R_3$, $R_4$, $R_5$, and $R_6$ independently represent a hydrogen atom or a hydrocarbon group containing at least one carbon atom, wherein a hydrocarbon group optionally includes one or more heteroatoms selected from nitrogen, oxygen, sulfur, and halide atoms; wherein one or more nitrogen atoms are cation radicals, and the one or more cation radicals are charge balanced by one or more anions.

12. The microelectronic structure of claim 11 wherein the one or more near-infrared absorbing triphenylamine-based dyes absorb electromagnetic radiation within a wavelength range of 500 nm to 1200 nm.

13. The microelectronic structure of claim 11 wherein the solid near-infrared absorbing film is an anti-reflective layer.

14. The microelectronic structure of claim 11 wherein the anti-reflective layer is a bottom anti-reflective layer.

15. The microelectronic structure of claim 13 wherein the anti-reflective layer is an underlayer.

16. A method for patterning a photoresist layer coated on a microelectronic substrate, the method comprising:
(i) providing a microelectronic substrate;
(ii) forming a near-infrared absorbing layer over the microelectronic substrate, wherein the near-infrared absorbing film includes one or more near-infrared absorbing triphenylamine-based dyes;
(iii) forming a photoresist layer over the near-infrared absorbing layer;
(iv) aligning and focusing a focal plane position of the photoresist layer by sensing near-infrared emissions reflected from the microelectronic substrate containing the near-infrared absorbing layer and photoresist layer; and
(v) exposing the photoresist layer to an exposure beam which patterns the photoresist, wherein said one or more near-infrared absorbing dyes have the following generic formula:

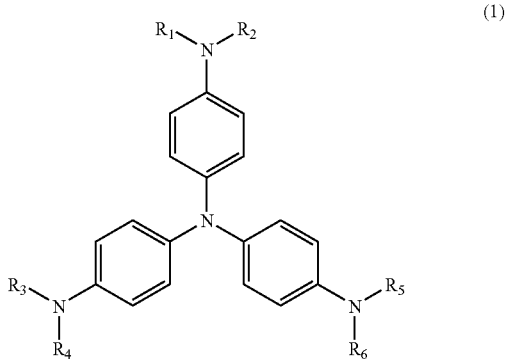

(1)

wherein at least one of $R_1$, $R_2$, $R_3$, $R_4$, $R_5$, and $R_6$ is selected from the group consisting of a cylic ether group, a hydroxyl group, and a combination thereof and the remaining $R_1$, $R_2$, $R_3$, $R_4$, $R_5$, and $R_6$ independently represent a hydrogen atom or a hydrocarbon group containing at least one carbon atom, wherein a hydrocarbon group optionally includes one or more heteroatoms selected from nitrogen, oxygen, sulfur, and halide atoms; wherein one or more nitrogen atoms are cation radicals, and the one or more cation radicals are charge balanced by one or more anions.

17. The method of claim 16 wherein the one or more near-infrared absorbing triphenylamine-based dyes absorb electromagnetic radiation within a wavelength range of 500 nm to 1200 nm.

* * * * *